US011107785B2

(12) United States Patent
Hsu

(10) Patent No.: US 11,107,785 B2
(45) Date of Patent: Aug. 31, 2021

(54) SEMICONDUCTOR DEVICE WITH A PLURALITY OF LANDING PADS AND METHOD FOR FABRICATING THE SAME

(71) Applicant: NANYA TECHNOLOGY CORPORATION, New Taipei (TW)

(72) Inventor: Ping Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 105 days.

(21) Appl. No.: 16/582,191

(22) Filed: Sep. 25, 2019

(65) Prior Publication Data
US 2021/0091028 A1    Mar. 25, 2021

(51) Int. Cl.
*H01L 23/00* (2006.01)
*H01L 27/108* (2006.01)

(52) U.S. Cl.
CPC .......... *H01L 24/09* (2013.01); *H01L 27/1087* (2013.01); *H01L 27/10829* (2013.01); *H01L 27/10885* (2013.01); *H01L 27/10888* (2013.01); *H01L 27/10891* (2013.01)

(58) Field of Classification Search
CPC combination set(s) only.
See application file for complete search history.

(56) References Cited

U.S. PATENT DOCUMENTS

| 2003/0001179 A1* | 1/2003 | Takeuchi | H01L 22/34 257/296 |
| 2007/0241380 A1* | 10/2007 | Hasunuma | H01L 27/10814 257/296 |
| 2010/0237394 A1* | 9/2010 | Park | H01L 27/0207 257/296 |
| 2012/0241832 A1* | 9/2012 | Fischer | H01L 27/10873 257/311 |
| 2013/0029467 A1* | 1/2013 | Otsuka | H01L 21/76224 438/381 |
| 2013/0248989 A1* | 9/2013 | Lee | H01L 29/78 257/330 |

FOREIGN PATENT DOCUMENTS

| TW | 201909340 A | 3/2019 |
| TW | 201909340 A | 3/2019 |
| TW | 201909387 A | 3/2019 |

OTHER PUBLICATIONS

Office Action dated Jan. 7, 2021 related to Taiwanese Application No. 109114931.

* cited by examiner

*Primary Examiner* — Nduka E Ojeh

(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate, a plurality of conductive features positioned above the substrate, a plurality of landing pads positioned above the substrate, a coverage layer positioned above the substrate, and a plurality of capacitor structures positioned above the substrate. An angle between the axes of two adjacent landing pads is less than 180 degrees.

20 Claims, 28 Drawing Sheets

SEMICONDUCTOR DEVICE WITH A PLURALITY OF LANDING PADS AND METHOD FOR FABRICATING THE SAME

TECHNICAL FIELD

The present disclosure relates to a semiconductor device and a method for fabricating the semiconductor device, and more particularly to a semiconductor device with a plurality of landing pads and a method for fabricating the semiconductor device with a plurality of selectively-formed anisotropic landing pads.

DISCUSSION OF THE BACKGROUND

Semiconductor device have applications in many electronic devices, including cellular telephones and other communication devices, automotive electronics, and other technology platforms. With increased demand for improved functionality and miniaturization in portable devices such as cell phones, digital cameras and laptop computers, there is a need to provide package-on-package semiconductor devices with flexible interconnect geometry compatible with pick-and-place and molding processes while also having minimal package size. Package-on-package stacking technology is becoming widely used in semiconductor device manufacturing and will play an increasingly important role in the future. In addition to providing space-saving advantages, package-on-package stacking also results in better electrical performance of the device, since the shorter routing of interconnections between circuits results in faster signal propagation and reduction in noise and cross-talk. However, a variety of issues arise during the package-on-package stacking process and impact the final electrical characteristics, quality, and yield. Therefore, challenges remain in achieving improved performance, quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a plurality of conductive features positioned above the substrate, a plurality of landing pads positioned above the substrate, a coverage layer positioned above the substrate, and a plurality of capacitor structures positioned above the substrate. An angle between the axes of two adjacent landing pads is less than 180 degrees.

In some embodiments, the plurality of conductive features are positioned below the plurality of capacitor structures.

In some embodiments, the plurality of conductive features are positioned above the plurality of capacitor structures.

In some embodiments, the semiconductor device further comprises a plurality of word lines positioned in the substrate, and a first doped region positioned between an adjacent pair of the plurality of word lines, wherein the plurality of conductive features are positioned on the first doped region.

In some embodiments, the plurality of landing pads are positioned between a plurality of bit lines and a first doped region.

In some embodiments, the semiconductor device further comprises a plurality of isolation structures positioned in the substrate, wherein the plurality of isolation structures are separated from each other and define a plurality of active regions of the substrate.

In some embodiments, the semiconductor device further comprises a second doped region and a plurality of active regions, wherein each of the plurality of active regions intersects two word lines, and the second doped region is positioned between one of the two word lines and one of a plurality of isolation structures.

In some embodiments, the plurality of landing pads are positioned between the plurality of capacitor structures and the second doped regions.

In some embodiments, two of a plurality of word lines extend along a first direction and the plurality of active regions extend along a direction that is slanted with respect to the first direction.

In some embodiments, the semiconductor device further comprises a plurality of bit line contacts positioned above the substrate and a plurality of bit lines positioned above the substrate, wherein one of the plurality of bit line contacts is positioned on the coverage layer and is positioned under one of the plurality of bit lines.

In some embodiments, the plurality of capacitor structures comprise a plurality of bottom electrodes inwardly positioned above the substrate, a capacitor insulating layer positioned on the plurality of bottom electrodes, and a top electrode positioned on the capacitor insulating layer.

Another aspect of the present disclosure provides a method for fabricating a semiconductor device including providing a substrate, forming a plurality of conductive features positioned above the substrate; forming a coverage layer positioned above the substrate; and forming a plurality of landing pads positioned above the substrate. An angle between the axes of two adjacent landing pads is less than 180 degrees.

In some embodiments, the method for fabricating the semiconductor device further comprises: forming a plurality of capacitor structures positioned above the substrate.

In some embodiments, the plurality of conductive features are positioned below the plurality of capacitor structures.

In some embodiments, the plurality of conductive features are positioned above the plurality of capacitor structures.

In some embodiments, the method for fabricating the semiconductor device further comprises: forming a plurality of word lines positioned in the substrate and a first doped region positioned between an adjacent pair of the plurality of word lines, wherein the plurality of conductive features are positioned on the first doped region.

In some embodiments, a plurality of landing pads are positioned between a plurality of bit lines and the first doped region.

In some embodiments, the method for fabricating the semiconductor device further comprises: forming a plurality of bit line contacts and a plurality of bit lines, wherein one of the plurality of bit line contacts is positioned on the coverage layer and is positioned under one of the plurality of bit lines.

In some embodiments, the plurality of capacitor structures comprise a plurality of bottom electrodes inwardly positioned above the substrate, a capacitor insulating layer positioned on the plurality of bottom electrodes, and a top electrode positioned on the capacitor insulating layer.

In some embodiments, the plurality of landing pads are positioned between the plurality of capacitor structures and a plurality of second doped regions.

Due to the design of the semiconductor device of the present disclosure, the anisotropic landing pads may increase flexibility in interconnect geometry of the semiconductor device; therefore, the tolerance of the semiconductor device alignment may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
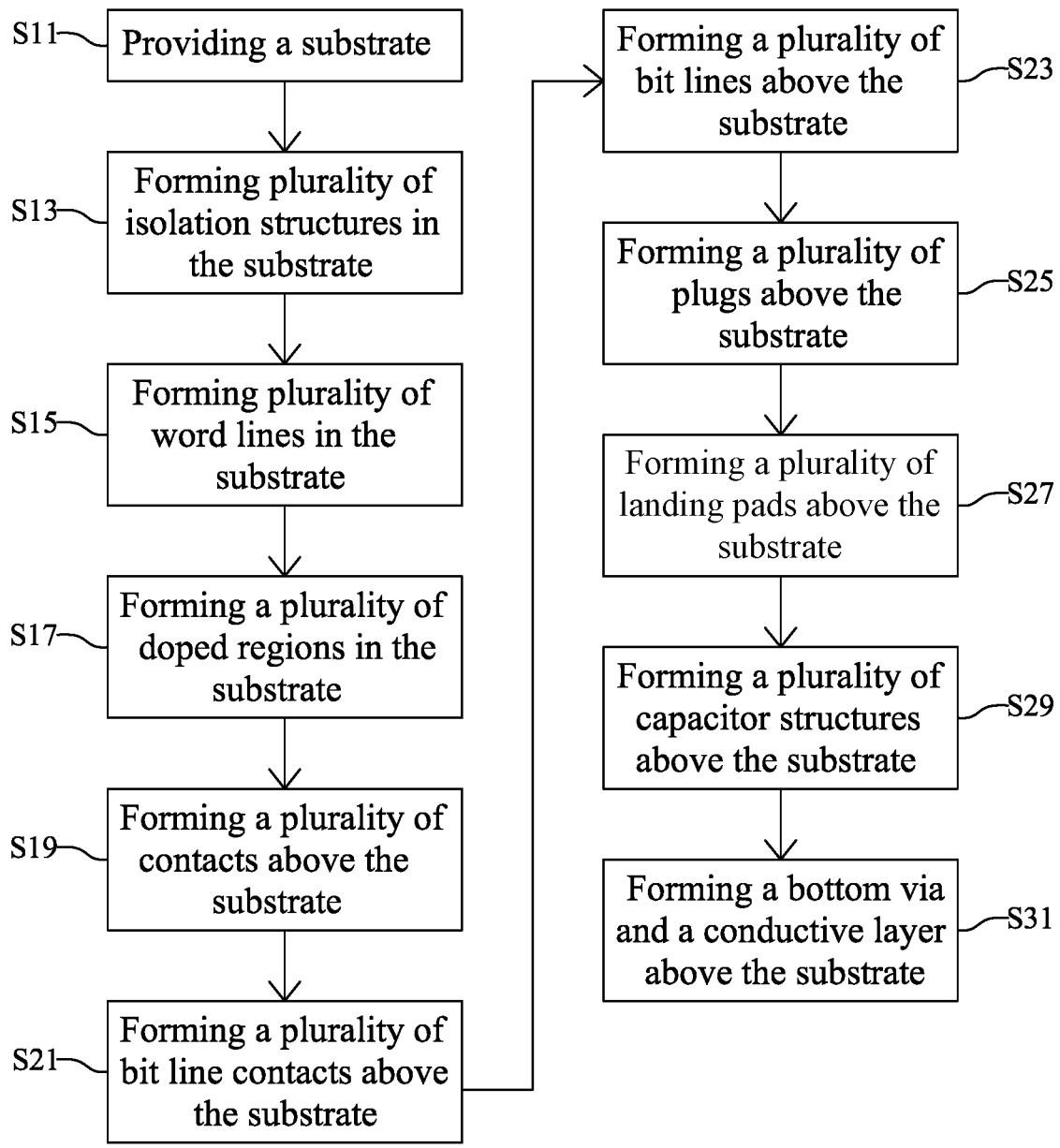
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
FIGS. 2 and 3 illustrate, in schematic cross-sectional diagrams, part of a flow of fabricating a semiconductor device in accordance with one embodiment of the present disclosure.
Figure 3:
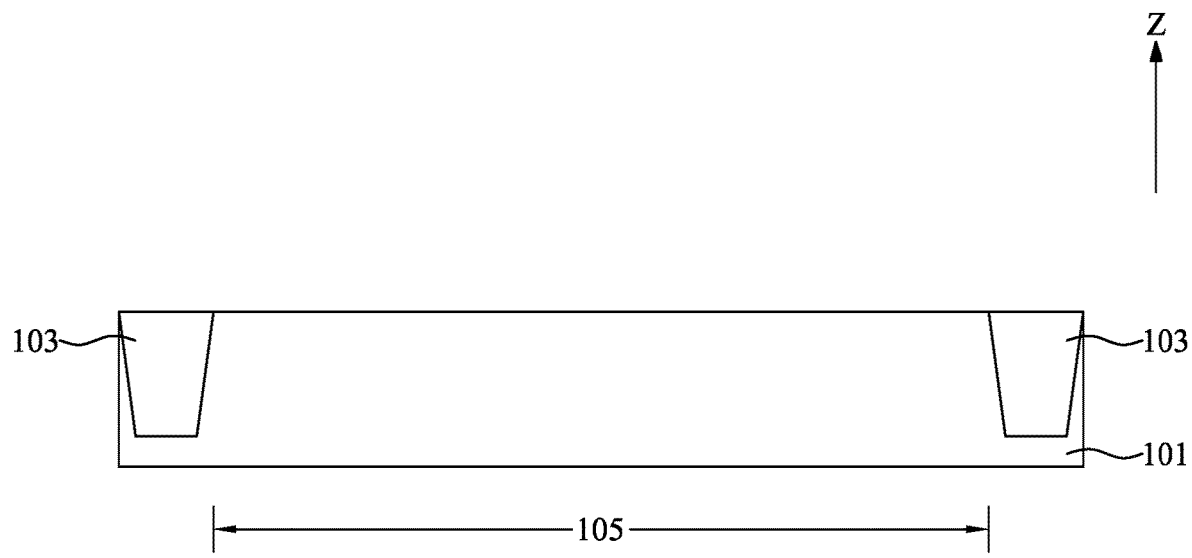
Figure 4:
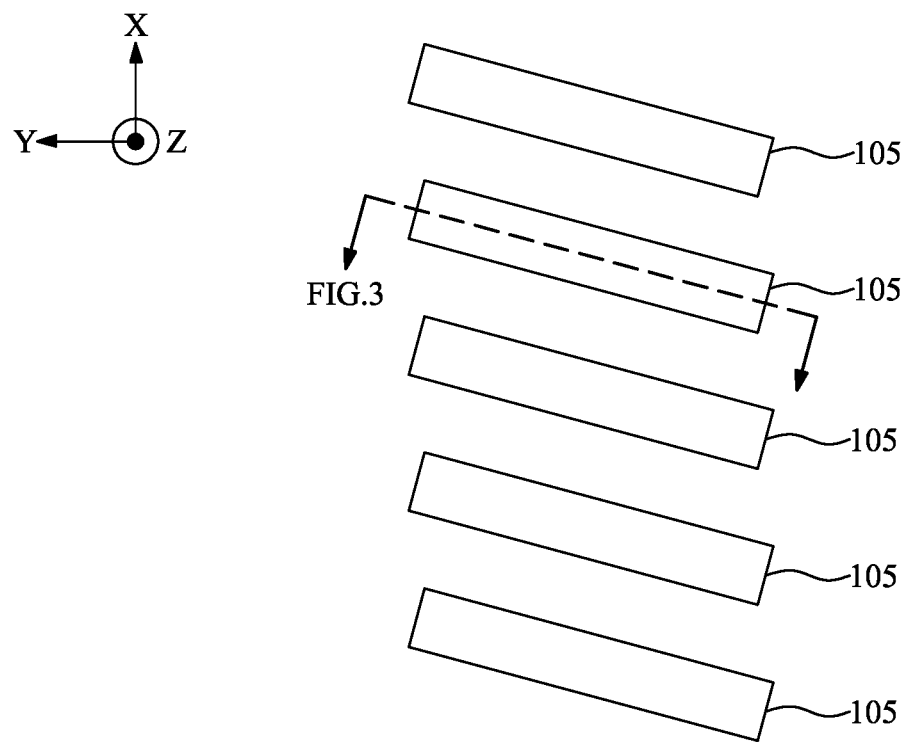
FIG. 4 illustrates, in a schematic top-view diagram, the semiconductor device in accordance with FIG. 3.

FIG. 1 illustrates, in a flowchart diagram form, a method 10 for fabricating a semiconductor device in accordance with one embodiment of the present disclosure. FIGS. 2 and 3 illustrate, in schematic cross-sectional diagrams, part of a flow of fabricating a semiconductor device in accordance with one embodiment of the present disclosure. FIG. 4 illustrates, in a schematic top-view diagram, the semiconductor device in accordance with FIG. 3.

With reference to FIGS. 1 and 2, at step S1, a substrate 101 may be provided. The substrate 101 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, or indium gallium phosphide.

With reference to FIG. 1 and FIGS. 3 and 4, at step S13, a plurality of isolation structures 103 may be formed in the substrate 101. The plurality of isolation structures 103 are separated from each other in a cross-sectional view and define a plurality of active regions 105. The plurality of isolation structures 103 may be formed of, for example, an insulating material such as silicon oxide, silicon nitride, silicon oxynitride, silicon nitride oxide, fluoride-doped silicate, or the like. The plurality of active regions 105 may extend in a direction slanted with respect to a first direction X in a top-view diagram. It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 5:
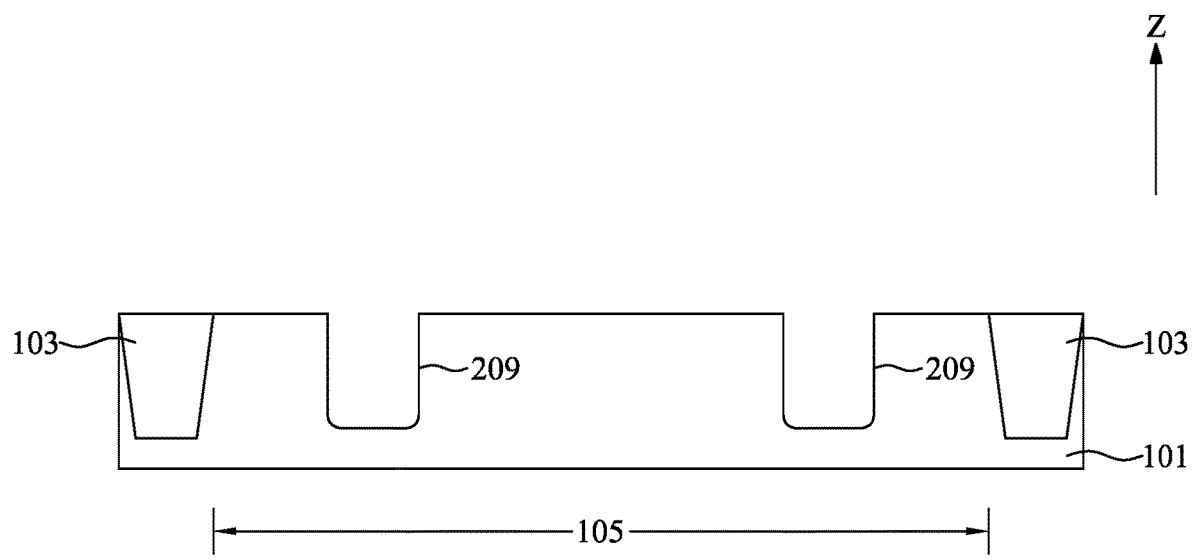
FIGS. 5 to 7 illustrate, in schematic cross-sectional diagrams, part of the flow of fabricating the semiconductor device in accordance with one embodiment of the present disclosure.
Figure 6:
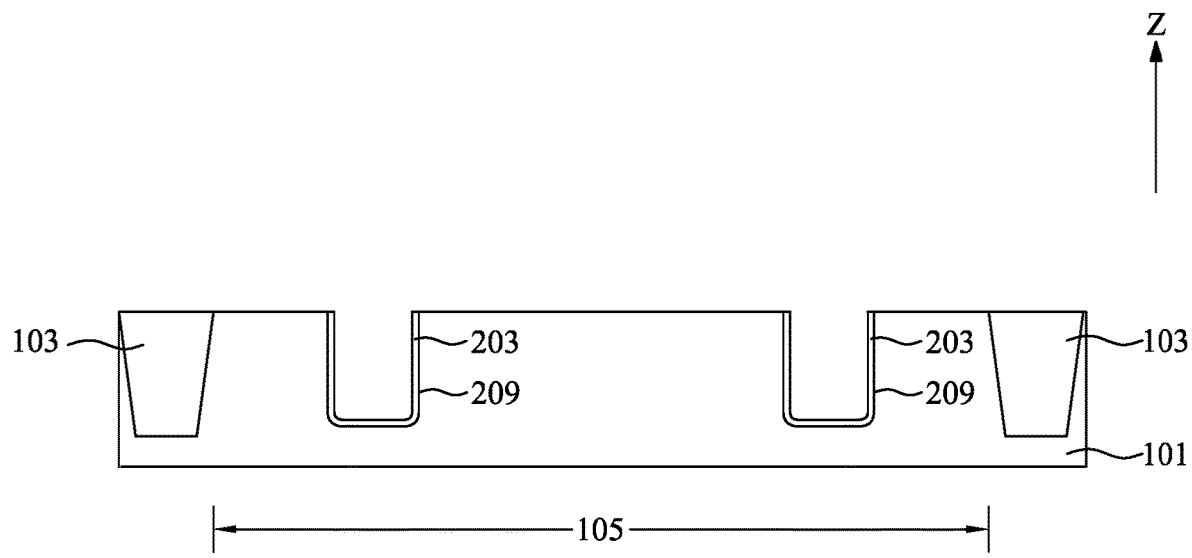
Figure 7:
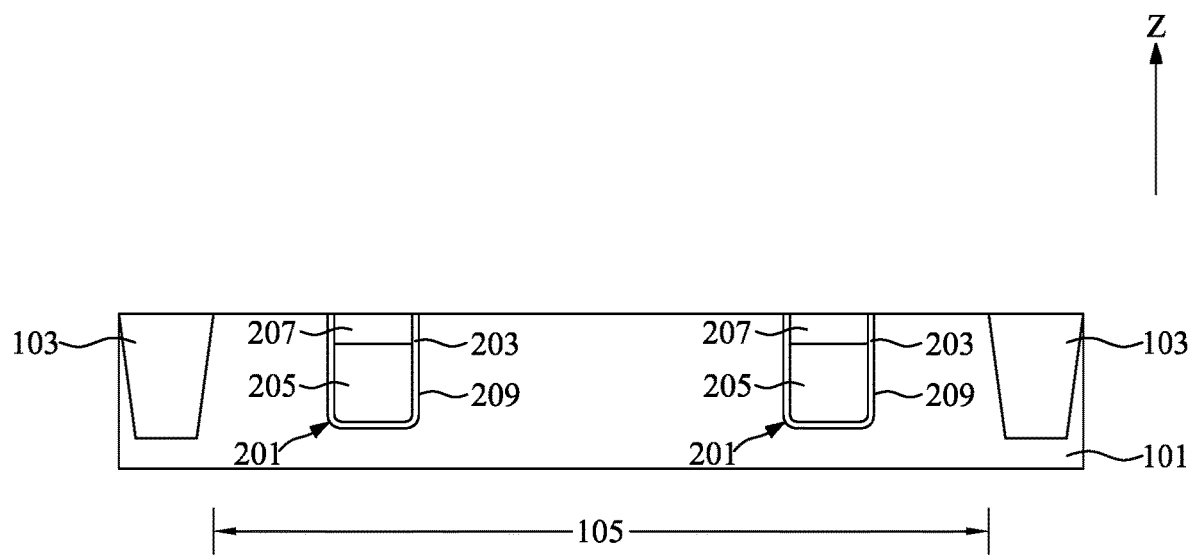
Figure 8:
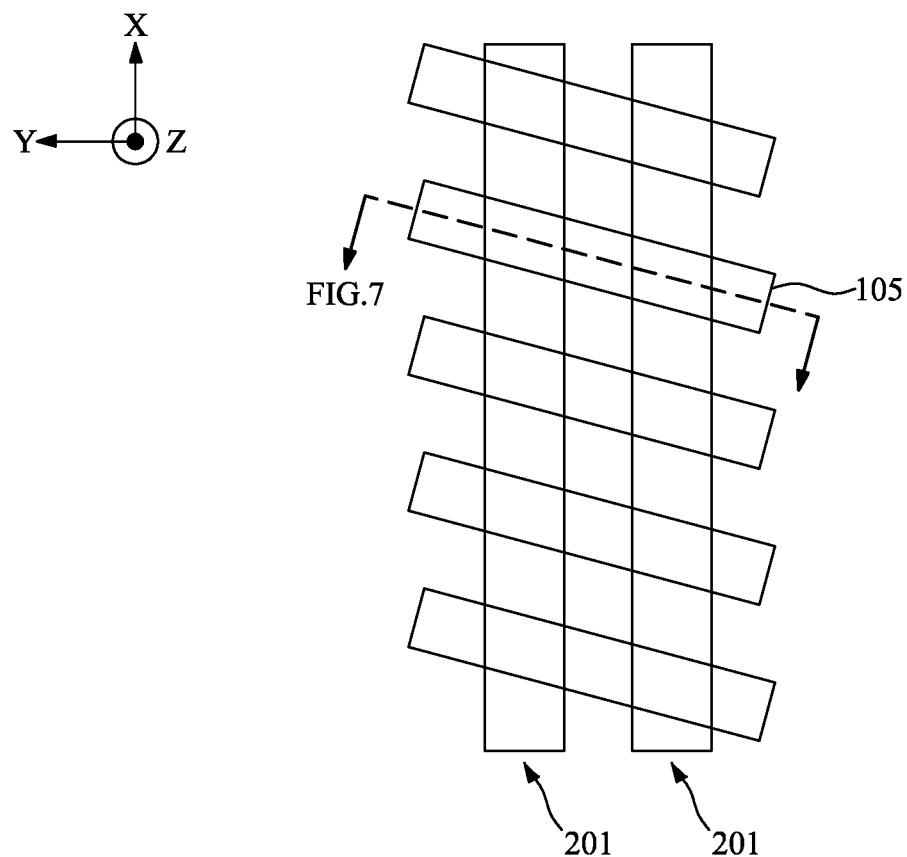
FIG. 8 illustrates, in a schematic top-view diagram, the semiconductor device in accordance with FIG. 7.

FIGS. 5 to 7 illustrate, in schematic cross-sectional diagrams, part of the flow of fabricating the semiconductor device in accordance with one embodiment of the present disclosure. FIG. 8 illustrates, in a schematic top-view diagram, the semiconductor device in accordance with FIG. 7.

With reference to FIG. 1 and FIGS. 5 to 8, at step S15, a plurality of word lines 201 may be formed in the substrate 101. In the embodiment depicted, the plurality of word lines 201 may extend along the first direction X. Each one of the plurality of word lines 201 includes a bottom layer 203, a middle layer 205, a top layer 207, and a trench opening 209. With reference to FIG. 5, in the embodiment depicted, a photolithography process may be used to pattern the substrate 101 to define positions of the plurality of trench openings 209. An etch process, such as an anisotropic dry etch process, may be performed to form the plurality of trench openings 209 in the substrate 101. With reference to FIG. 6, after the etch process, the plurality of bottom layers 203 may be correspondingly formed and attached to sidewalls of the plurality of trench openings 209 and bottoms of the plurality of trench openings 209. The plurality of bottom layers 203 may be formed of, for example, silicon oxide, silicon oxynitride, silicon nitride oxide, silicon nitride, or the like.

With reference to FIGS. 7 and 8, the plurality of middle layers 205 may be correspondingly formed on the plurality of bottom layers 203. Top surfaces of the plurality of middle layers 205 may be lower than a top surface of the substrate 101. The plurality of middle layers 205 may be formed of, for example, doped polysilicon, metal material, or metal silicide. Metal silicide may be, for example, nickel silicide, platinum silicide, titanium silicide, molybdenum silicide, cobalt silicide, tantalum silicide, tungsten silicide, or the like. The plurality of top layers 207 may be correspondingly formed on the plurality of middle layers 205. Top surfaces of the plurality of top layers 207 may be at the same vertical level as the top surface of the substrate 101. The plurality of top layers 207 may be formed of, for example, silicon oxide, silicon oxynitride, silicon nitride oxide, silicon nitride, or the like.

Figure 9:
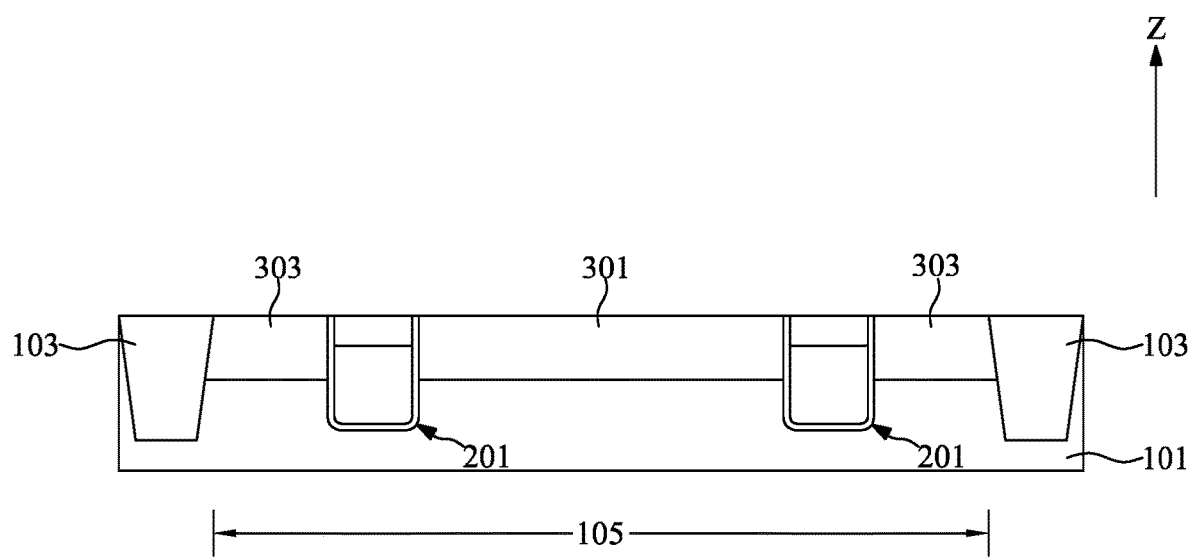
FIGS. 9 and 10 illustrate, in schematic cross-sectional diagrams, part of the flow of fabricating the semiconductor device in accordance with one embodiment of the present disclosure.

FIG. 9 illustrates, in a schematic cross-sectional diagram, part of the flow of fabricating the semiconductor device in accordance with one embodiment of the present disclosure.

With reference to FIG. 1 and FIG. 9, at step S17, a plurality of doped regions may be formed in the plurality of active regions 105 of the substrate 101. The plurality of doped regions may include a first doped region 301 and two second doped regions 303. The first doped region 301 is disposed between an adjacent pair of the plurality of word lines 201. The second doped regions 303 are respectively disposed between the plurality of isolation structures 103 and the plurality of word lines 201. The first doped region 301 and the second doped regions 303 are respectively doped with a dopant such as phosphorus, arsenic, or antimony. The first doped region 301 and the second doped regions 303 respectively have dopant concentrations ranging from about 1E17 atoms/cm$^3$ to about 1E19 atoms/cm$^3$.

Figure 10:
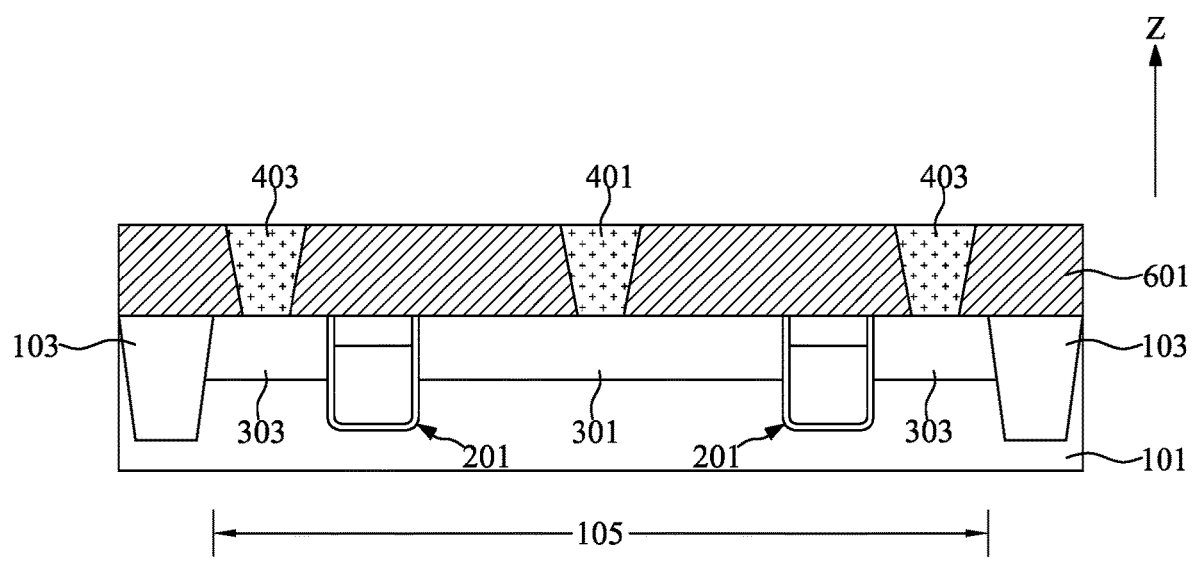
Figure 11:
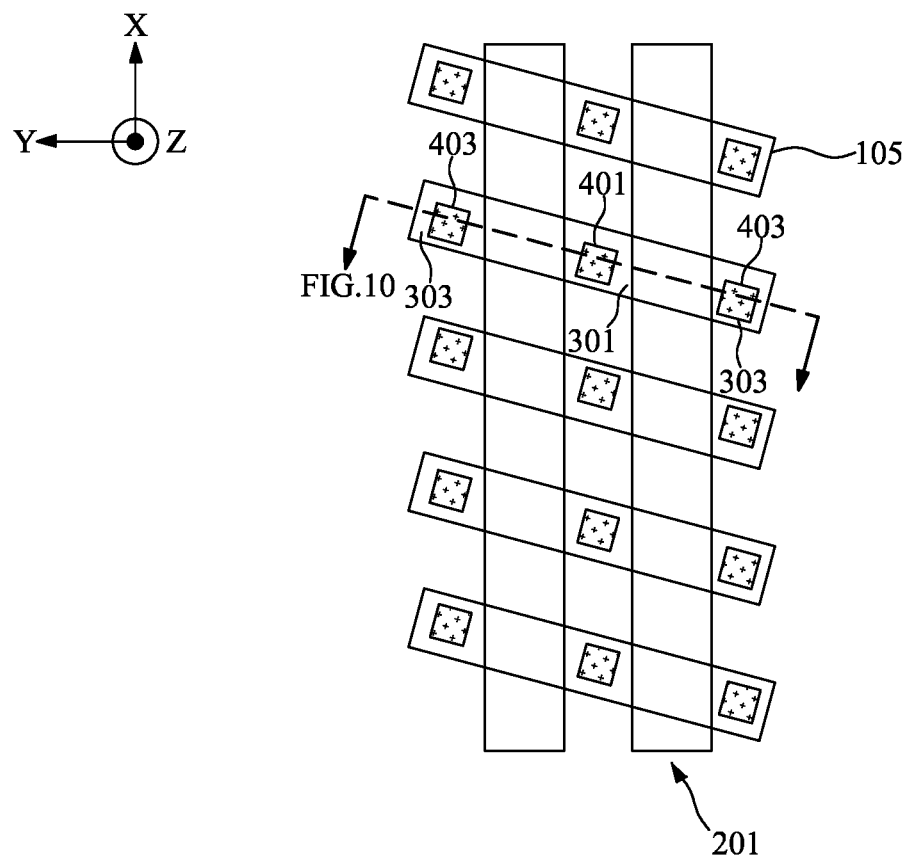
FIG. 11 illustrates, in a schematic top-view diagram, the semiconductor device in accordance with FIG. 10.

FIG. 10 illustrates, in a schematic cross-sectional diagram, part of the flow of fabricating the semiconductor device in accordance with one embodiment of the present disclosure. FIG. 11 illustrates, in a schematic top-view diagram, the semiconductor device in accordance with FIG. 10.

With reference to FIG. 1 and FIGS. 10 and 11, at step S19, a plurality of conductive features may be formed above the substrate 101. A first insulating film 601 may be formed on the substrate 101. The first insulating film 601 may be formed of, for example, silicon nitride, silicon oxide, silicon oxynitride, undoped silica glass, borosilica glass, phosphosilica glass, borophosphosilica glass, or a combination thereof, but is not limited thereto. The plurality of conductive features may be formed in the first insulating film 601. The plurality of conductive features may include a first contact 401 and second contacts 403. A photolithography process may be used to pattern the first insulating film 601 to define positions of the plurality of contacts. An etch process, such as an anisotropic dry etch process, may be performed after the photolithography process to form a plurality of contact openings in the first insulating film 601. After the etch process, a conductive material, for example, aluminum, copper, tungsten, cobalt, or other suitable metal or metal alloy, is deposited by a metallization process, such as chemical vapor deposition, physical vapor deposition, sputtering, or the like, in the plurality of contact openings to form the plurality of contacts. A planarization process, such as chemical mechanical polishing, may be performed after the metallization process to remove excess material and provide a substantially flat surface for subsequent processing steps.

Specifically, with reference to FIGS. 10 and 11, the first contact 401 is disposed on the first doped region 301 and is electrically connected to the first doped region 301. The second contacts 403 are respectively disposed on the second doped regions 303 and are respectively electrically connected to the second doped regions 303. In the embodiment depicted, the first contact 401 includes tungsten. In addition, the second contacts 403 include tungsten. Defects may be easily formed on a top surface of the first contact 401, which includes tungsten, when the top surface of the first contact 401 is exposed to oxygen or air. The defects may affect the yield of the semiconductor device.

Figure 12:
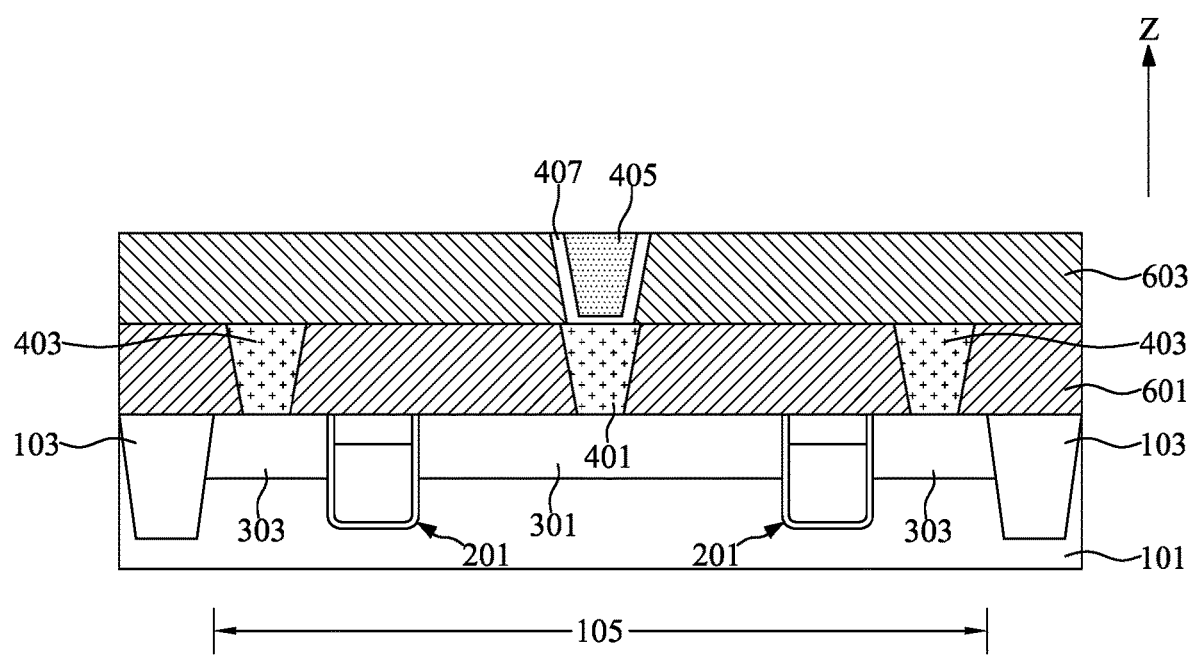
FIG. 12 illustrates, in a schematic cross-sectional diagram, part of the flow of fabricating the semiconductor device in accordance with one embodiment of the present disclosure.
Figure 13:
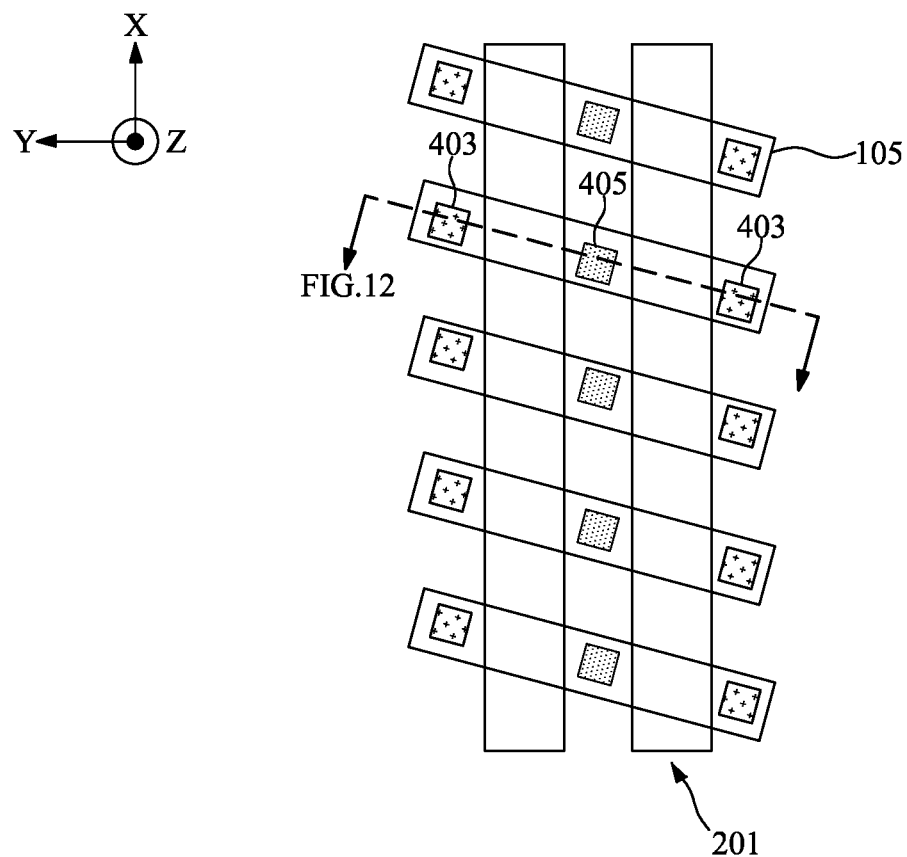
FIG. 13 illustrates, in a schematic top-view diagram, the semiconductor device in accordance with FIG. 12.

FIG. 12 illustrates, in a schematic cross-sectional diagram, part of the flow of fabricating the semiconductor device in accordance with one embodiment of the present disclosure. FIG. 13 illustrates, in a schematic top-view diagram, the semiconductor device in accordance with FIG. 12.

With reference to FIG. 1 and FIGS. 12 and 13, at step S21, a plurality of bit line contacts 405 may be formed above the substrate 101. A second insulating film 603 may be formed on the first insulating film 601. The second insulating film 603 may be formed of a same material as the first insulating film 601, but is not limited thereto. A photolithography process may be used to pattern the second insulating film 603 to define positions of the plurality of bit line contacts 405. An etch process, such as an anisotropic dry etch process, may be performed after the photolithography process to form a plurality of bit line contact openings in the second insulating film 603. A top surface of the first contact 401 may be exposed through the plurality of bit line contact openings. A cleaning process using a reducing agent may be optionally performed to remove the defects on the top surface of the first contact 401, which includes tungsten. The reducing agent may be titanium tetrachloride, tantalum tetrachloride, or a combination thereof.

With reference to FIGS. 12 and 13, after the cleaning process, a coverage layer 407, which includes tungsten nitride, may cover bottoms and sidewalls of the plurality of bit line contact openings. The coverage layer 407 may prevent the top surface of the first contact 401, which includes tungsten, from being exposed to oxygen or air; therefore, the coverage layer 407 may reduce formation of the defects on the top surface of the first contact 401, which includes tungsten. A conductive material, for example, aluminum, copper, tungsten, cobalt, or other suitable metal or metal alloy, is deposited by a metallization process, such as chemical vapor deposition, physical vapor deposition, sputtering, or the like, in the plurality of bit line contact openings to form the plurality of bit line contacts 405. A planarization process, such as chemical mechanical polishing, may be performed after the metallization process to remove excess material and provide a substantially flat surface for subsequent processing steps.

With reference to FIGS. 12 and 13, the plurality of bit line contacts 405 are correspondingly electrically connected to the first contacts 401; that is, the plurality of bit line contacts 405 are electrically coupled to the first doped region 301.

Figure 14:
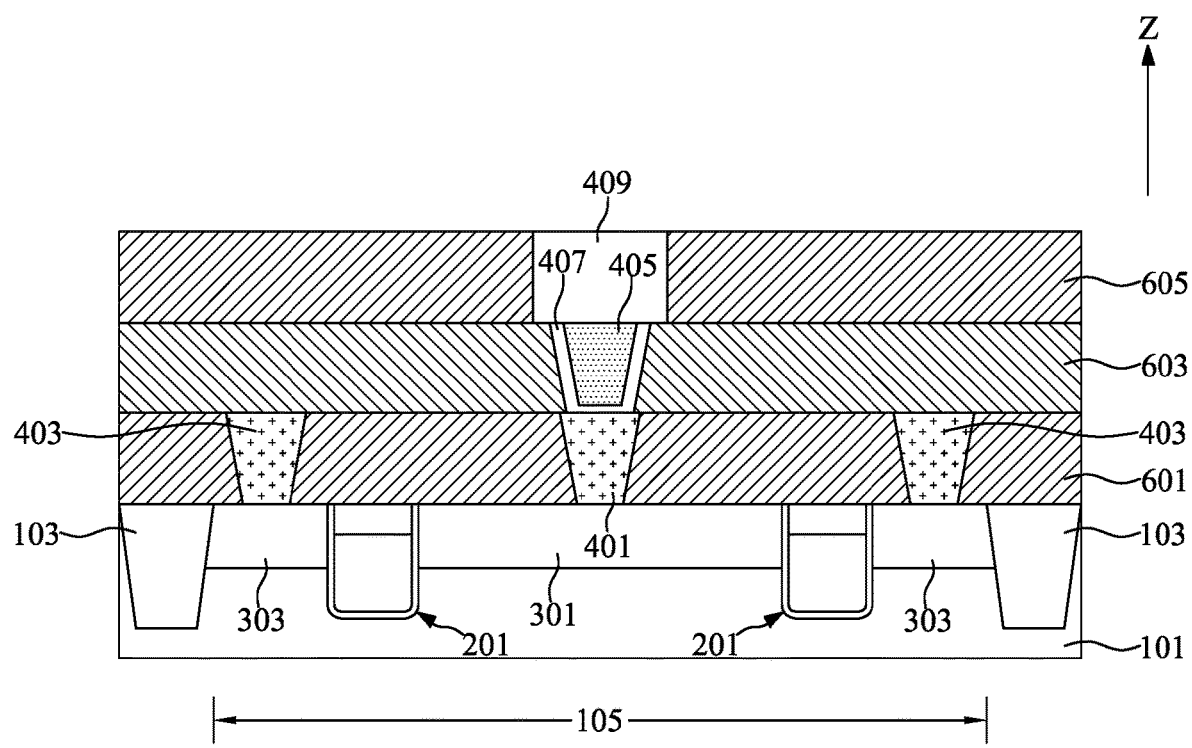
FIG. 14 illustrates, in a schematic cross-sectional diagram, part of the flow of fabricating the semiconductor device in accordance with one embodiment of the present disclosure.
Figure 15:
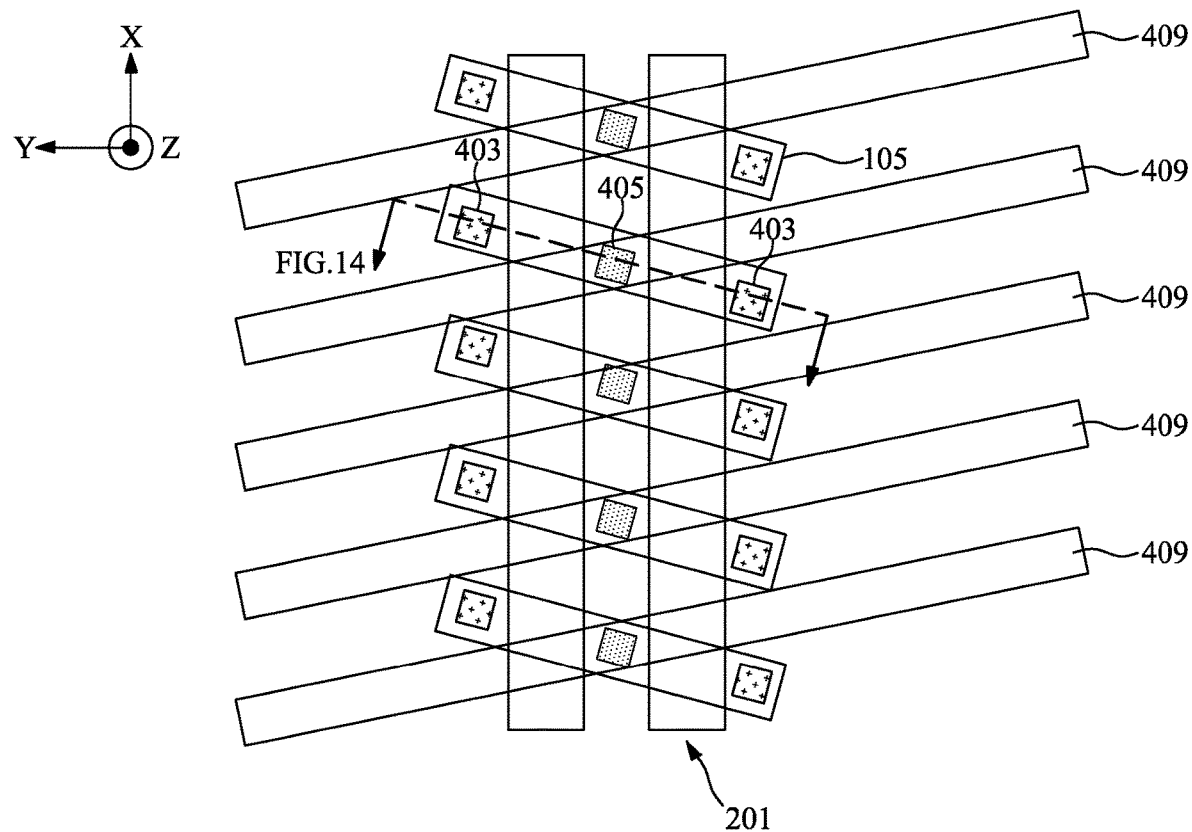
FIG. 15 illustrates, in a schematic top-view diagram, the semiconductor device in accordance with FIG. 14.

FIG. 14 illustrates, in a schematic cross-sectional diagram, part of the flow of fabricating the semiconductor device in accordance with one embodiment of the present disclosure. FIG. 15 illustrates, in a schematic top-view diagram, the semiconductor device in accordance with FIG. 14.

With reference to FIG. 1 and FIGS. 14 and 15, at step S23, a plurality of bit lines 409 may be formed above the substrate 101. A third insulating film 605 may be formed on the second insulating film 603. The third insulating film 605 may be formed of a same material as the first insulating film 601, but is not limited thereto. A photolithography process may be used to pattern the third insulating film 605 to define positions of the plurality of bit lines 409. An etch process, such as an anisotropic dry etch process, may be performed after the photolithography process to form a plurality of bit line trench openings in the third insulating film 605. After the etch process, a conductive material, for example, aluminum, copper, tungsten, cobalt, or other suitable metal or metal alloy, is deposited, by a metallization process, such as chemical vapor deposition, physical vapor deposition, sputtering, or the like, in the plurality of bit line trench openings to form the plurality of bit lines 409. A planarization process, such as chemical mechanical polishing, may be performed after the metallization process to remove excess material and provide a substantially flat surface for subsequent processing steps. The plurality of bit line contacts 405 are located at intersections of the plurality of bit lines 409 and the plurality of active regions 105.

Figure 16:
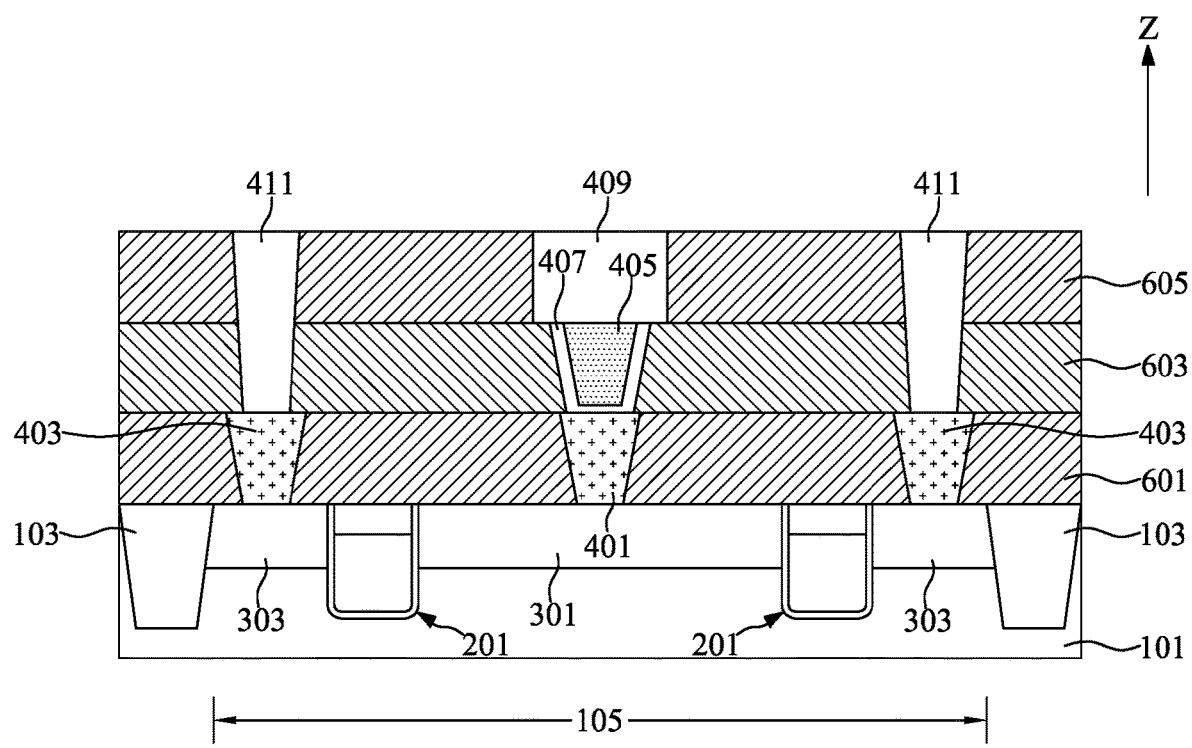
FIGS. 16 to 18 illustrate, in schematic cross-sectional diagrams, part of the flow of fabricating the semiconductor device in accordance with one embodiment of the present disclosure.

FIG. 16 illustrates, in a schematic cross-sectional diagram, part of the flow of fabricating the semiconductor device in accordance with one embodiment of the present disclosure.

With reference to FIG. 1 and FIG. 16, at step S25, a plurality of first plugs 411 may be formed above the substrate 101. A photolithography process may be used to pattern the third insulating film 605 to define positions of the plurality of first plugs 411. An etch process, such as an anisotropic dry etch process, may be performed after the photolithography process to form a plurality of plug openings penetrating through the third insulating film 605 and the second insulating film 603. After the etch process, a conductive material, for example, aluminum, copper, tungsten, cobalt, or other suitable metal or metal alloy, is deposited by a metallization process, such as chemical vapor deposition, physical vapor deposition, sputtering, or the like, in the plurality of plug openings to form the plurality of first plugs 411. A planarization process, such as chemical mechanical polishing, may be performed after the metallization process to remove excess material and provide a substantially flat surface for subsequent processing steps.

Figure 17:
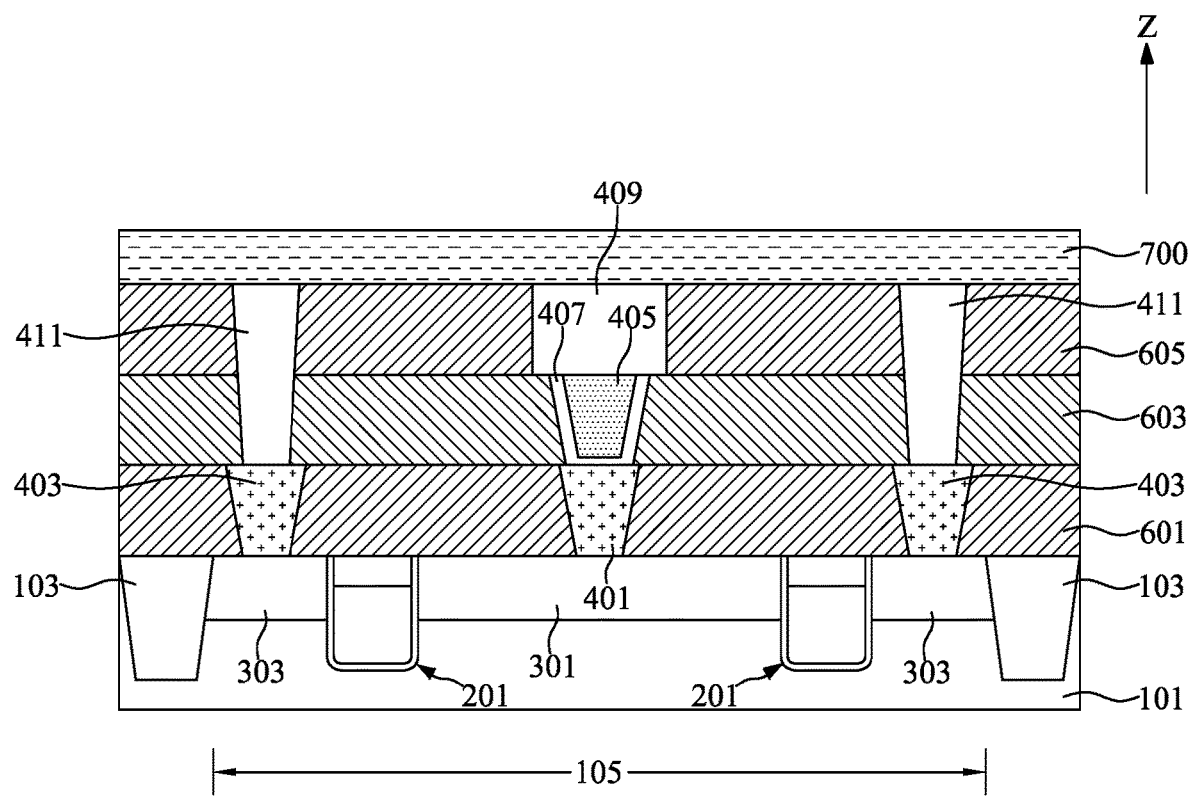
Figure 18:
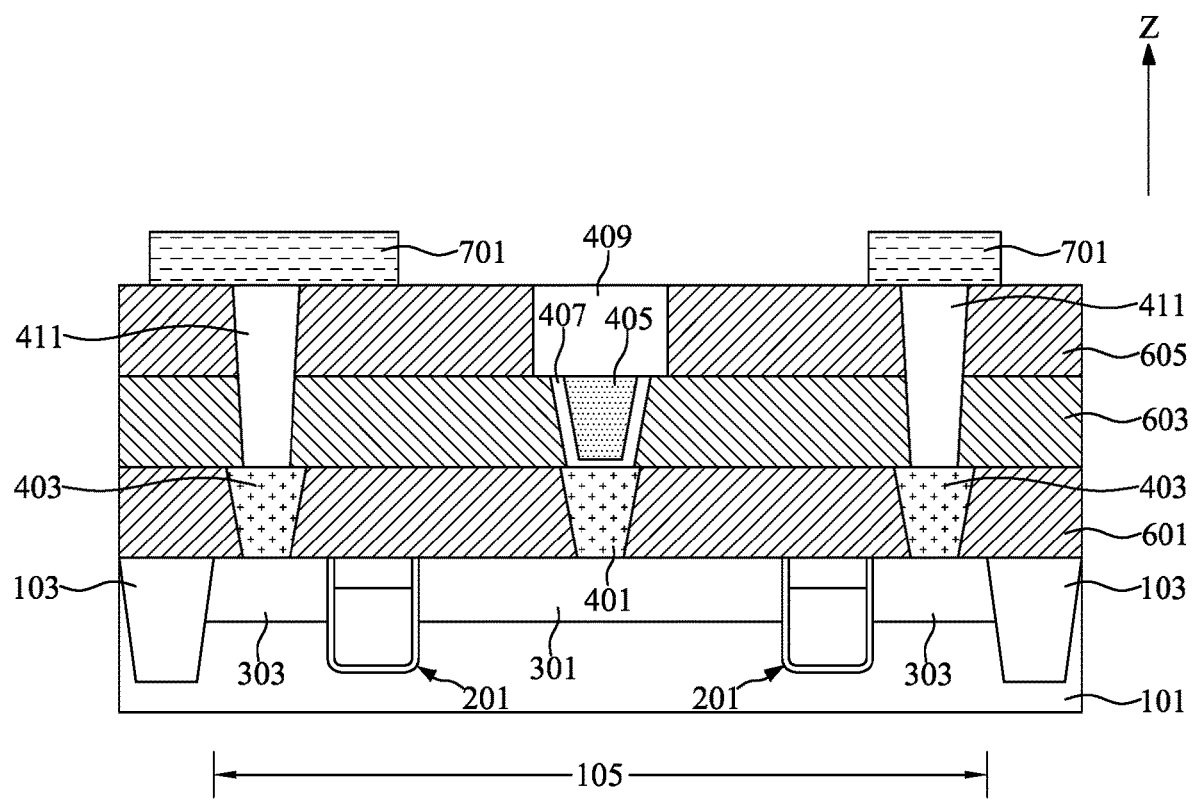
Figure 19:
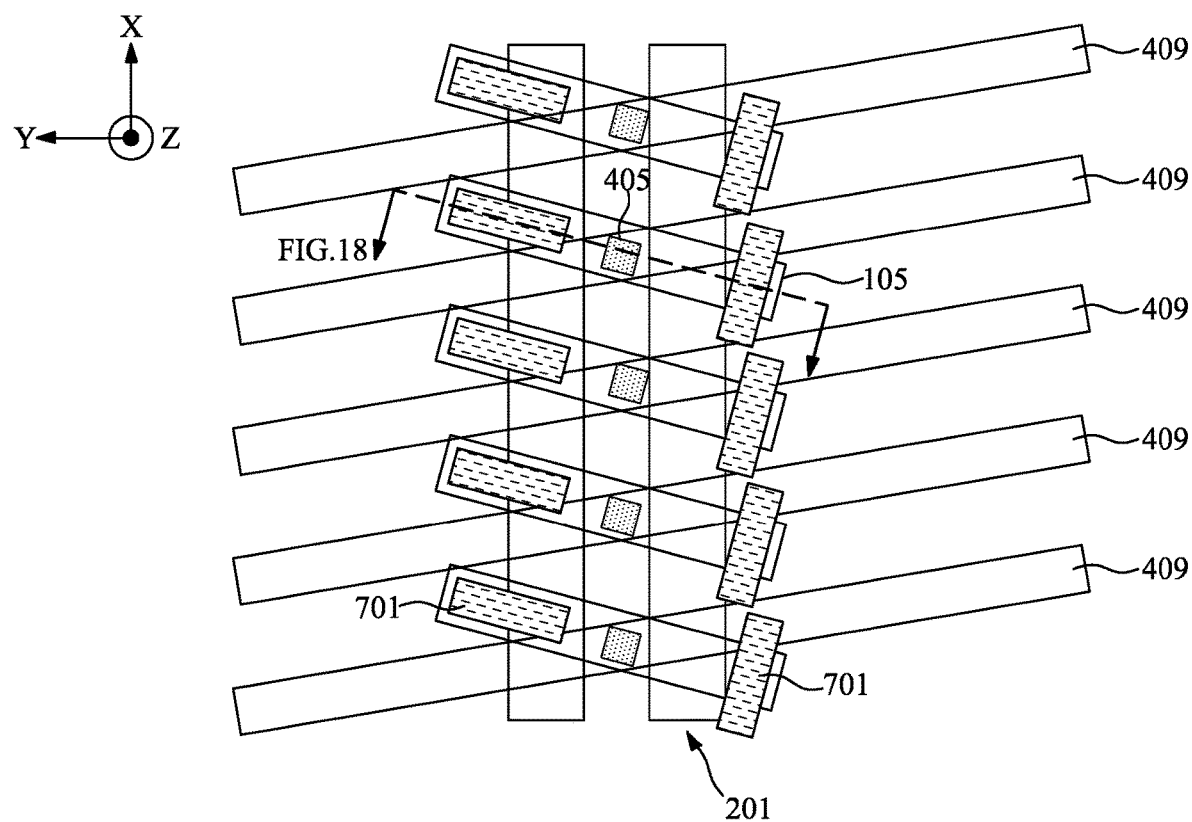
FIG. 19 illustrates, in a schematic top-view diagram, the semiconductor device in accordance with FIG. 18.

FIGS. 17 and 18 illustrate, in schematic cross-sectional diagrams, part of the flow of fabricating the semiconductor device in accordance with one embodiment of the present disclosure. FIG. 19 illustrates, in a schematic top-view diagram, the semiconductor device in accordance with FIG. 18.

With reference to FIG. 1 and FIGS. 17 to 19, at step S27, a plurality of landing pads 701 may be formed above the substrate 101. The plurality of landing pads 701 may be formed of, for example, a conductive material, such as aluminum, copper, tungsten, cobalt, or other suitable metal or metal alloy. A pad layer 700 may be formed above the substrate 101. The plurality of landing pads 701 may be formed from the pad layer 700. A self-aligned etching process may be used to pattern the pad layer 700 to form the plurality of landing pads 701. Generally, the self-aligned etching process is prefaced by forming the pad layer 700 over the third insulating film 605 and forming a hard mask layer over the pad layer 700, with an ion implantation process subsequently performed on the hard mask layer to define positions of the plurality of landing pads 701. Next, a self-aligned etching may be performed to pattern the plurality of landing pads 701 on the hard mask layer, and the plurality of landing pads 701 may be formed by etching the pad layer 700. Specifically, after the performing of the self-aligned etching process, an anisotropic etching is performed on the pad layer 700, forming the plurality of landing pads 701 having different dimensions in different directions. More specifically, an angle between the axes of two adjacent landing pads 701 is less than 180 degrees; preferably, the angle between the axes of two adjacent landing pads 701 is 90 degrees (as shown in FIG. 19). The plurality of landing pads 701 are anisotropic and may increase flexibility in interconnect geometry of the semiconductor device; therefore, the tolerance of the semiconductor device alignment may be increased.

Figure 20:
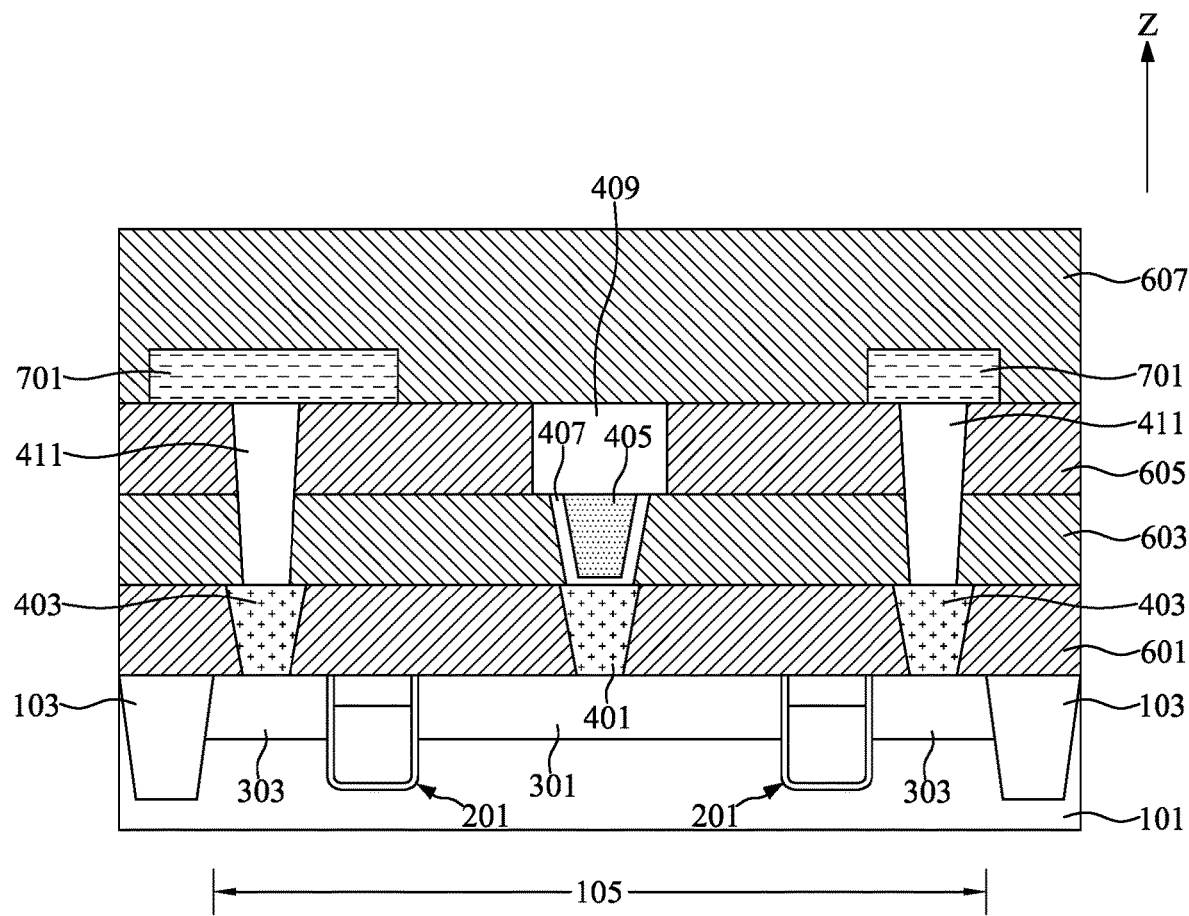
FIGS. 20 to 22 illustrate, in schematic cross-sectional diagrams, part of the flow of fabricating the semiconductor device in accordance with one embodiment of the present disclosure.
Figure 21:
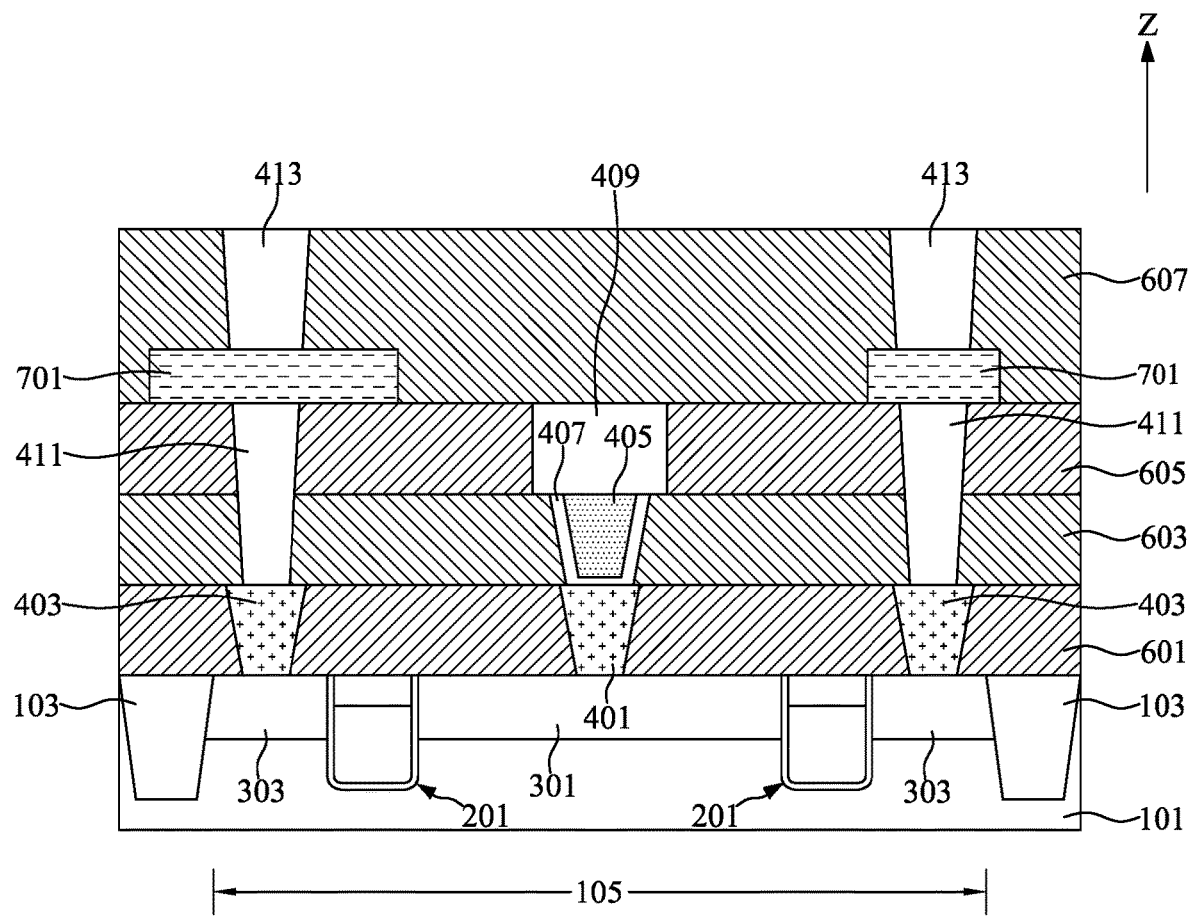

With reference to FIG. 1 and FIGS. 20 to 23, at step S29, a plurality of capacitor structures 500 may be formed above the substrate 101. The plurality of capacitor structures 500 may include a plurality of bottom electrodes 501, a capacitor insulating layer 503, and a top electrode 505. With reference to FIGS. 20 to 21, a plurality of second plugs 413 may be formed above the substrate 101. A fourth insulating film 607 may be formed on the third insulating film 605. The fourth insulating film 607 may be formed of a same material as the first insulating film 601, but is not limited thereto. A first photolithography process may be used to pattern the fourth insulating film 607 to define positions of the plurality of second plugs 413. An etch process, such as an anisotropic dry etch process, may be performed after the photolithography process to form a plurality of plug openings penetrating through the fourth insulating film 607. After the etch process, a conductive material, for example, aluminum, copper, tungsten, cobalt, or other suitable metal or metal alloy, is deposited by a metallization process, such as chemical vapor deposition, physical vapor deposition, sputtering, or the like, in the plurality of plug openings to form the plurality of second plugs 413, wherein the plurality of second plugs 413 are positioned above the plurality of landing pads 701. A planarization process, such as chemical mechanical polishing, may be performed after the metallization process to remove excess material and provide a substantially flat surface for subsequent processing steps. After the forming of the plurality of second plugs 413, a fifth insulating film 609 may be formed on the fourth insulating film 607. The fifth insulating film 609 may be formed of a same material as the first insulating film 601, but is not limited thereto. A second photolithography process may be used to pattern the fifth insulating film 609 to define positions of a plurality of capacitor trenches 507. An etch process, such as an anisotropic dry etch process, may be performed after the photolithography process to form the plurality of capacitor trenches 507 penetrating through the fifth insulating film 609. The plurality of second plugs 413 may be exposed through the plurality of capacitor trenches 507.

Figure 22:
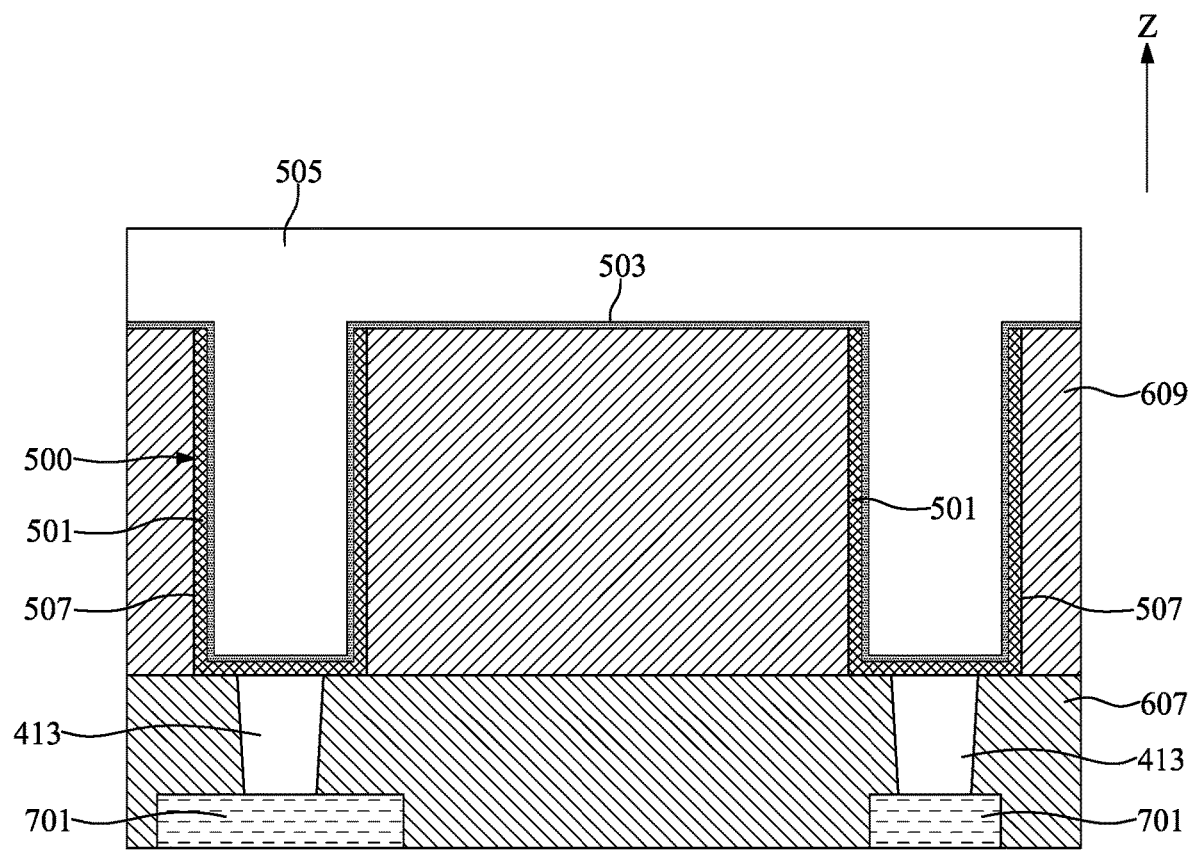
Figure 23:
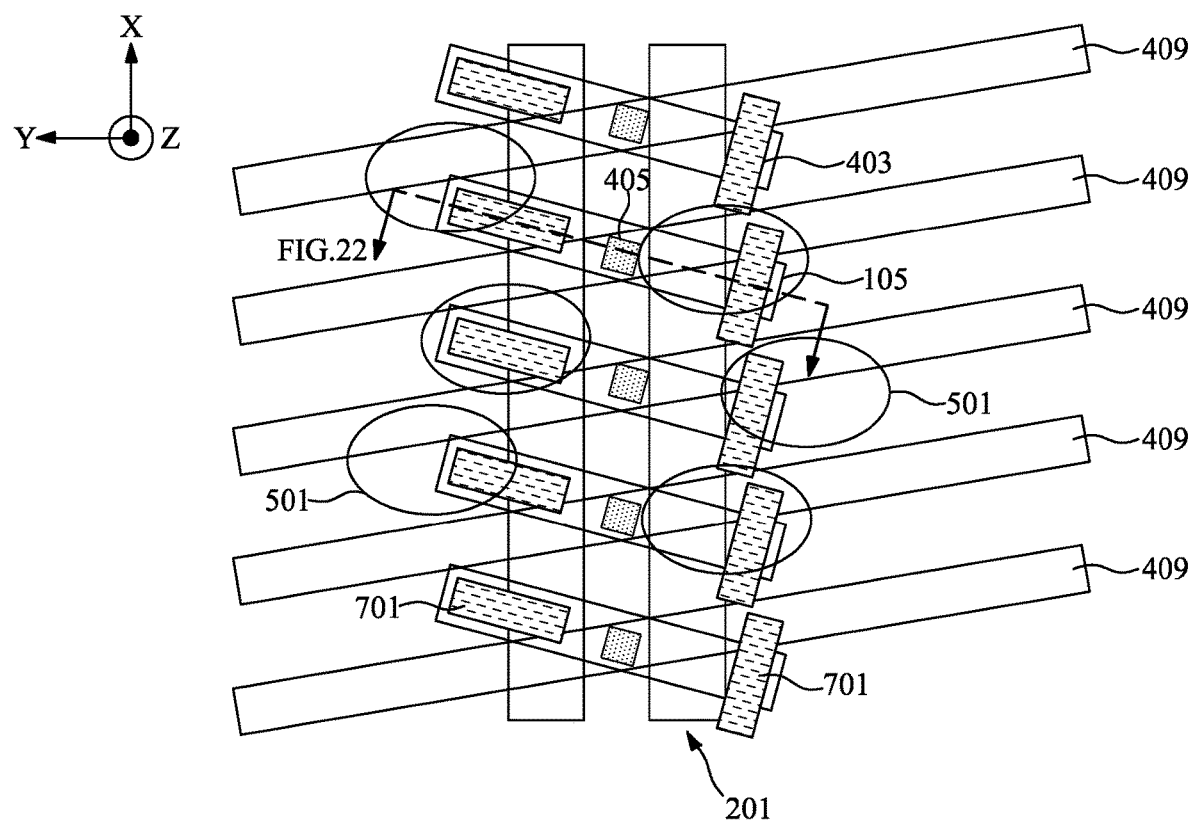
FIG. 23 illustrates, in a schematic top-view diagram, the semiconductor device in accordance with FIG. 22.

With reference to FIG. 22, the plurality of bottom electrodes 501 may be correspondingly respectively formed in the plurality of capacitor trenches 507; in other words, the plurality of bottom electrodes 501 may be inwardly formed in the fifth insulating film 609. The plurality of bottom electrodes 501 may be formed of, for example, doped polysilicon, metal silicide, aluminum, copper, or tungsten. The plurality of bottom electrodes 501 may be respectively correspondingly connected to the plurality of second plugs 413. The capacitor insulating layer 503 may be formed to attach to sidewalls and bottoms of the plurality of bottom electrodes 501 and the top surfaces of the fifth insulating film 609. The capacitor insulating layer 503 may be a single layer formed of a high dielectric constant material such as barium strontium titanate, lead zirconium titanate, titanium oxide, aluminum oxide, hafnium oxide, yttrium oxide, zirconium oxide, or the like. Alternatively, in another embodiment, the capacitor insulating layer 503 may be multiple layers consisting of silicon oxide, silicon nitride, and silicon oxide. With reference to FIGS. 22 and 23, the top electrode 505 may be formed to fill the plurality of capacitor trenches 507 and cover the capacitor insulating layer 503. The top electrode 505 may be formed of, for example, doped polysilicon, copper, or aluminum.

Figure 24:
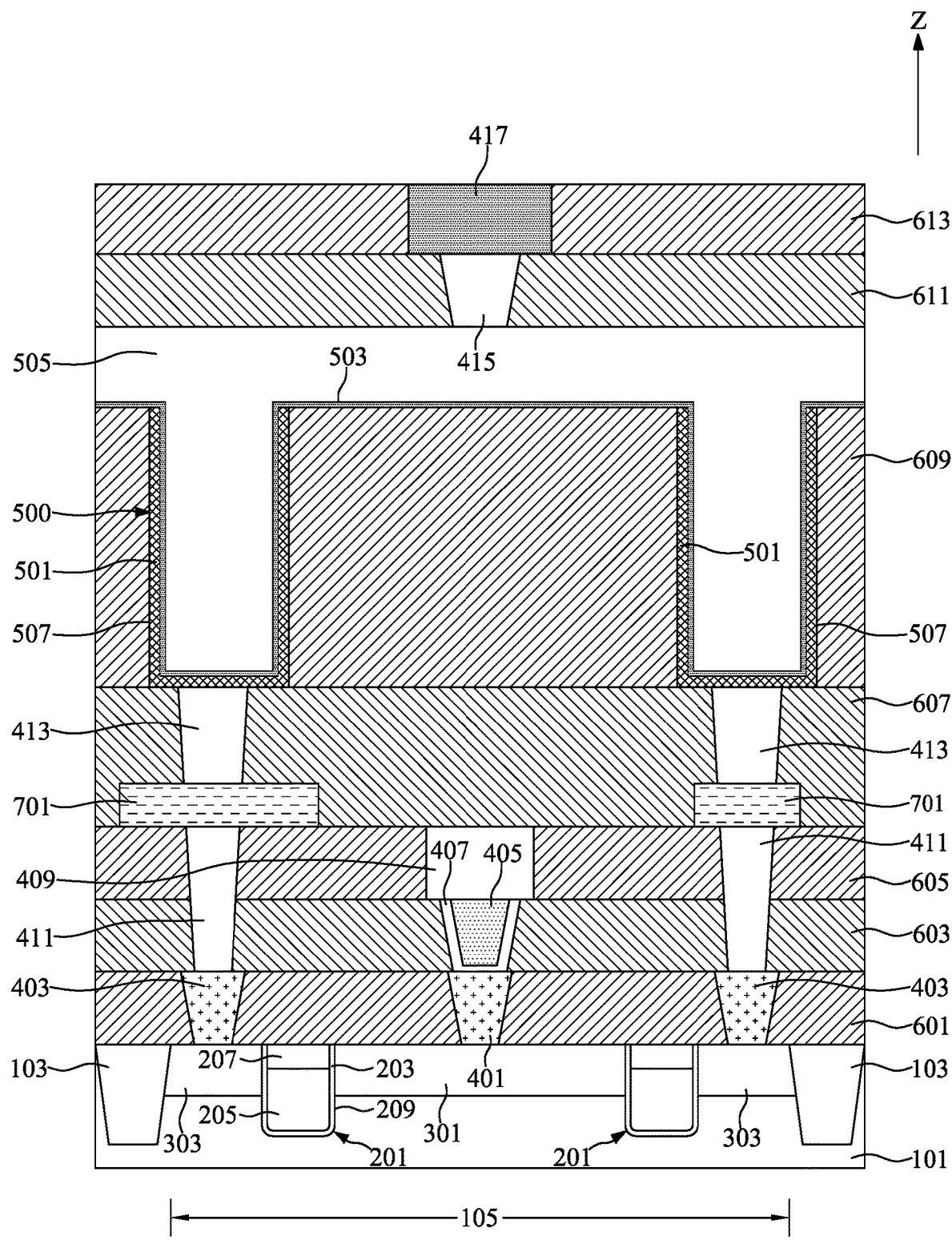
FIG. 24 illustrates, in a schematic cross-sectional view diagram, some semiconductor devices in accordance with some embodiments of the present disclosure.
Figure 25:
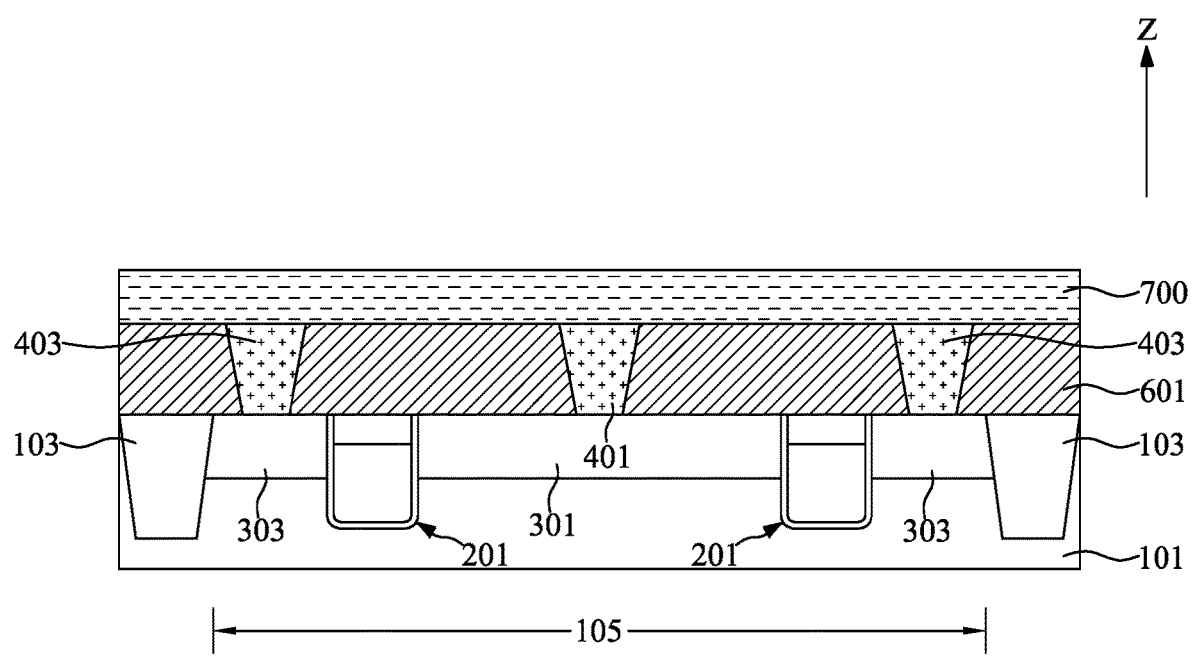
FIGS. 25 and 26 illustrate, in schematic cross-sectional diagrams, part of the flow of fabricating the semiconductor device in accordance with another embodiment of the present disclosure.
Figure 26:
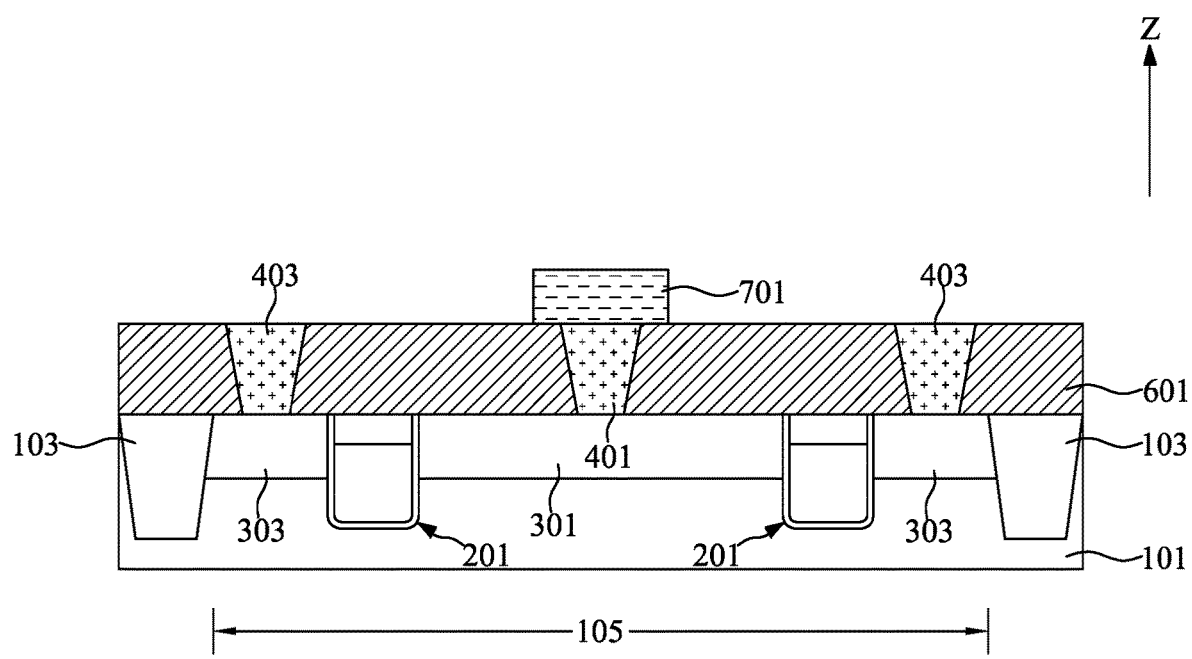
Figure 27:
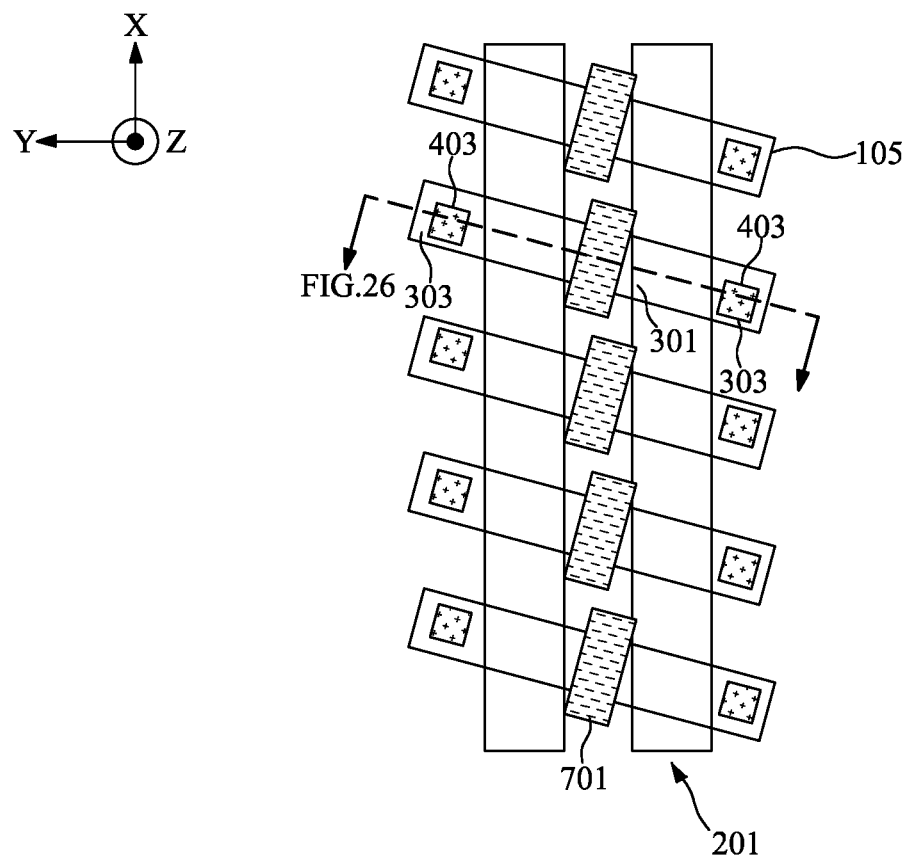
FIG. 27 illustrates, in a schematic top-view diagram, the semiconductor device in accordance with FIG. 26.

FIG. 24 illustrates, in a schematic cross-sectional diagram, part of the flow of fabricating the semiconductor device in accordance with one embodiment of the present disclosure.

With reference to FIG. 1 and FIG. 24, at step S31, a bottom via 415 and a conductive layer 417 may be formed above the substrate 101, and a sixth insulating film 611 may be formed on the top electrode 505. The sixth insulating film 611 may be formed of a same material as the first insulating film 601, but is not limited thereto. A photolithography process may be used to pattern the sixth insulating film 611 to define positions of the bottom via 415. An etch process, such as an anisotropic dry etch process, may be performed after the photolithography process to form a bottom via opening penetrating through the sixth insulating film 611. After the etch process, a conductive material, for example, aluminum, copper, tungsten, cobalt, or other suitable metal or metal alloy, is deposited by a metallization process, such as chemical vapor deposition, physical vapor deposition, sputtering, or the like, in the bottom via opening to form the bottom via 415 in the sixth insulating film 611. A planarization process, such as chemical mechanical polishing, may be performed after the metallization process to remove excess material and provide a substantially flat surface for subsequent processing steps. After the forming of the bottom via 415, a seventh insulating film 613 may be formed on the sixth insulating film 611. The seventh insulating film 613 may be formed of a same material as the first insulating film 601, but is not limited thereto. A photolithography process may be used to pattern the seventh insulating film 613 to define a position of the conductive layer 417. An etch process, such as an anisotropic dry etch process, may be performed after the photolithography process to form a conductive layer trench in the seventh insulating film 613. The top surface of the bottom via 415 may be exposed through the conductive layer trench. Next, a conductive material, for example, aluminum, copper, tungsten, cobalt, or other suitable metal or metal alloy, is deposited by a metallization process, such as chemical vapor deposition, physical vapor deposition, sputtering, or the like, in the conductive layer trench to form the conductive layer 417 in the seventh insulating film 613.

The plurality of landing pads 701 serve as relay stations for electrical connection with high aspect ratio structure, such as connecting the first plug 411 and the second plug 413.

In another embodiment, with reference to FIG. 1 and FIGS. 25 to 28, at step S27, the plurality of landing pads 701 may be formed on the substrate 101. The pad layer 700 may be formed above the substrate 101. The plurality of landing pads 701 may be formed from the pad layer 700. A self-aligned etching process may be used to pattern the pad layer 700 to form the plurality of landing pads 701. Generally, the self-aligned etching process is performed by forming the pad layer 700 over the first insulating film 601 and forming a hard mask layer over the pad layer 700, then performing an ion implantation process on the hard mask to define positions of the plurality of landing pads 701. Next, a self-aligned etching may be performed to pattern the plurality of landing pads 701 on the hard mask, and the plurality of landing pads 701 may be formed by etching the pad layer 700. Specifically, after performing the self-aligned etching process on the pad layer 700, the plurality of landing pads 701 are formed having different dimensions in different directions. More specifically, an angle between the axes of two adjacent landing pads 701 is less than 180 degrees; preferably, the angle between the axes of two adjacent landing pads 701 is 90 degrees (as shown FIG. 19). The plurality of landing pads 701 are anisotropic and may increase flexibility in interconnect geometry of the semiconductor device; therefore, the tolerance of the semiconductor device alignment may be increased.

Figure 28:
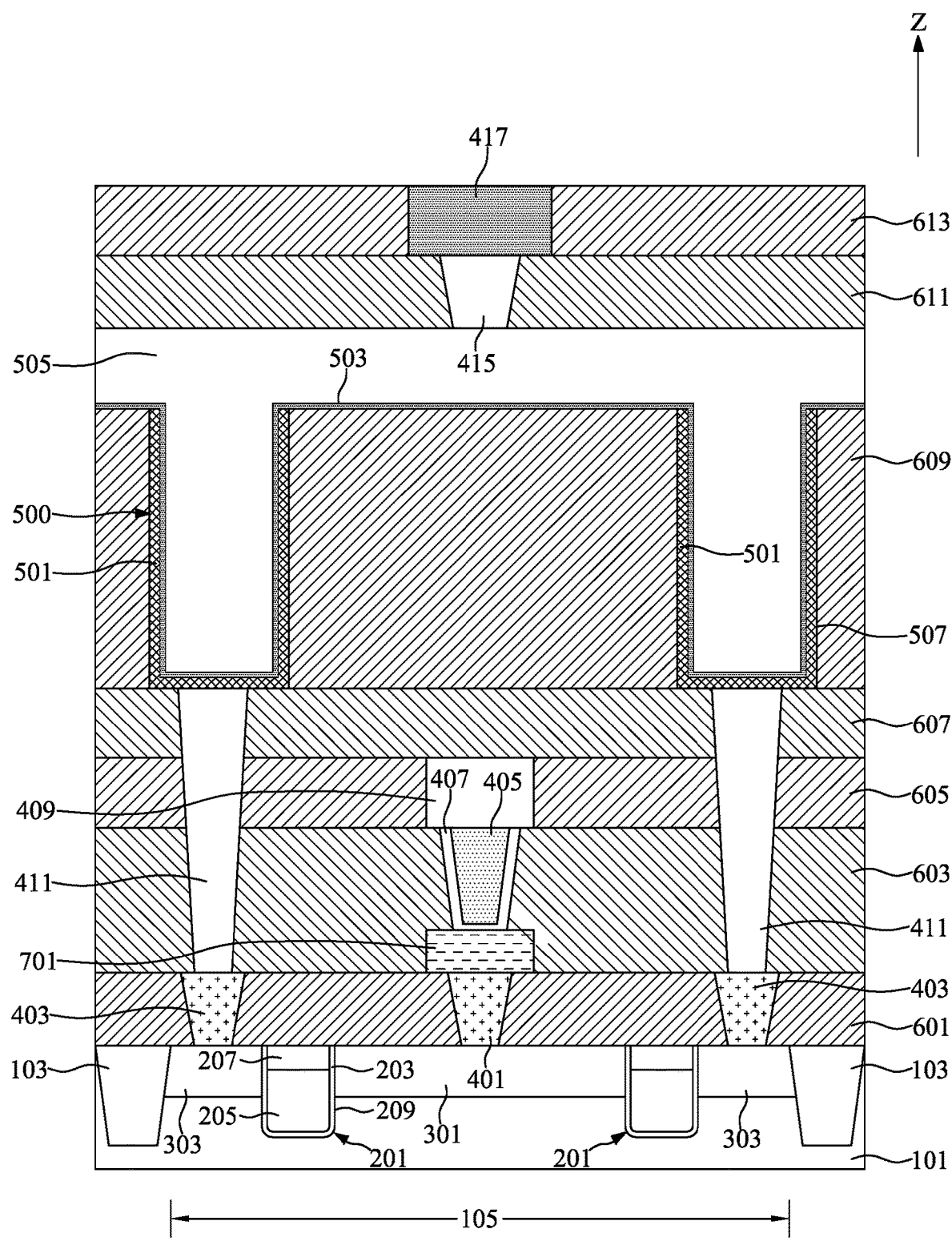
FIG. 28 illustrates, in a schematic cross-sectional view diagram, some semiconductor devices in accordance with another embodiment of the present disclosure.

With reference to FIG. 28, the semiconductor device may include a substrate 101, a plurality of isolation structures 103, a plurality of word lines 201, a plurality of doped regions, a plurality of insulating films, a plurality of conductive features, a plurality of bit line contacts 405, a coverage layer 407, a plurality of bit lines 409, a plurality of first plugs 411, a plurality of landing pads 701, a bottom via 415, a conductive layer 417, and a plurality of capacitor structures 500. It should be noted that, in the present disclosure, the plurality of conductive features may be regarded as a first contact 401, a second contact 403, and the bottom via 415, but are not limited thereto.

With reference to FIG. 28, the plurality of isolation structures 103 may be disposed in the substrate 101 and separated from each other. The plurality of isolation structures 103 may define a plurality of active regions 105. The plurality of word lines 201 may be disposed in the substrate 101 and separated from each other. Each one of the plurality of word lines 201 includes a bottom layer 203, a middle layer 205, and a top layer 207. The plurality of bottom layers 203 may be respectively inwardly disposed in the substrate 101. The plurality of middle layers 205 may be respectively correspondingly disposed on the plurality of bottom layers 203. Top surfaces of the plurality of middle layers 205 may be lower than a top surface of the substrate 101. The plurality of top layers 207 may be respectively correspondingly disposed on the plurality of middle layers 205. Top surfaces of the plurality of top layers 207 may be at the same vertical level as the top surface of the substrate 101.

With reference to FIG. 28, the plurality of doped regions may be respectively correspondingly disposed in the plurality of active regions 105 of the substrate 101. Each one of the plurality of doped regions includes a first doped region 301 and two second doped regions 303. In the each one of the plurality of doped regions disposed in corresponding one of the plurality of active regions 105, the first doped region 301 is disposed between an adjacent pair of the plurality of word lines 201. The second doped regions 303 are respectively disposed between the plurality of isolation structures 103 and the plurality of word lines 201.

With reference to FIG. 28, the plurality of insulating films may be disposed above the substrate 101. The plurality of insulating films may include a first insulating film 601, a second insulating film 603, a third insulating film 605, a fourth insulating film 607, a fifth insulating film 609, a sixth insulating film 611, and a seventh insulating film 613. The first insulating film 601 may be disposed on the substrate 101. The plurality of conductive features may be disposed in the first insulating film 601. The plurality of conductive features may include the first contact 401 and the second contacts 403. The first contact 401 is disposed on the first doped region 301 and is electrically connected to the first doped region 301. The second contacts 403 are respectively disposed on the second doped regions 303 and are respectively electrically connected to the second doped regions 303. In the embodiment depicted, the first contact 401 includes tungsten.

With reference to FIG. 28, the second insulating film 603 may be disposed on the first insulating film 601. The plurality of bit line contacts 405 may be disposed in the second insulating film 603. (Only one bit line contact 405 is shown in FIG. 28.) The coverage layer 407 may be disposed in the second insulating film 603 and on a top surface of the landing pad 701, in other words, the coverage layer 407 may disposed between the plurality of bit line contacts 405 and the landing pad 701. In addition, the coverage layer 407 may be attached to sidewalls of the plurality of bit line contacts 405. The coverage layer 407 may include tungsten nitride.

With reference to FIG. 28, the third insulating film 605 may be disposed on the second insulating film 603. The plurality of bit lines 409 may be disposed in the third insulating film 605 and on the plurality of bit line contacts 405 and the coverage layer 407. (Only one bit line is shown in FIG. 28.) The plurality of first plugs 411 may be disposed penetrating through the third insulating film 605 and the second insulating film 603. The plurality of first plugs 411 may be respectively correspondingly electrically connected to the second contacts 403. The fourth insulating film 607 may be disposed on the third insulating film 605. The plurality of landing pads 701 may be disposed in the second insulating film 603, wherein each of the plurality of landing pads 701 is positioned under the coverage layer 407.

With reference to FIG. 28, the fifth insulating film 609 may be disposed on the fourth insulating film 607. The plurality of capacitor structures 500 may be disposed in the fifth insulating film 609. The plurality of capacitor structures 500 may include a plurality of bottom electrodes 501, a capacitor insulating layer 503, and a top electrode 505. The plurality of bottom electrodes 501 may be inwardly disposed in the fifth insulating film 609. The capacitor insulating layer 503 may be disposed on the plurality of bottom electrodes 501. The top electrode 505 may be disposed on the capacitor insulating layer 503.

With reference to FIG. 28, the sixth insulating film 611 may be disposed on the top electrode 505. The bottom via 415 may be disposed in the sixth insulating film 611 and electrically connected to the top electrode 503. The bottom via 415 may include tungsten. A seventh insulating film 613 may be disposed on the sixth insulating film 611. The conductive layer 417 may be disposed in the seventh insulating film 613 and above the bottom via 415.

One aspect of the present disclosure provides a semiconductor device including a substrate, a plurality of conductive features positioned above the substrate, a plurality of landing pads positioned above the substrate, a coverage layer positioned above the substrate, and a plurality of capacitor structures positioned above the substrate. An angle between the axes of two adjacent landing pads is less than 180 degrees.

Another aspect of the present disclosure provides a method for fabricating a semiconductor device including providing a substrate, forming a plurality of conductive features positioned above the substrate; forming a coverage layer positioned above the substrate; and forming a plurality of landing pads positioned above the substrate. An angle between the axes of two adjacent landing pads is less than 180 degrees.

Due to the design of the semiconductor device of the present disclosure, the anisotropic landing pads may increase flexibility in interconnect geometry of the semiconductor device; therefore, the tolerance of the semiconductor device alignment may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate, including a plurality of active regions;
   a plurality of conductive features positioned above the substrate in each of the plurality of active regions;
   a plurality of landing pads positioned above the substrate in each of the plurality of active regions, wherein each of the plurality of landing pads includes an extending axis parallel to a top surface of the substrate, wherein an angle between the extending axes of two adjacent landing pads in each of the plurality of active regions is less than 180 degrees;
   a coverage layer positioned above the substrate in each of the plurality of active regions; and
   a plurality of capacitor structures positioned above the substrate.

2. The semiconductor device of claim 1, wherein the plurality of conductive features are positioned below the plurality of capacitor structures.

3. The semiconductor device of claim 1, wherein the plurality of conductive features are positioned above the plurality of capacitor structures.

4. The semiconductor device of claim 1, further comprising a plurality of word lines positioned in the substrate, and a first doped region positioned between an adjacent pair of the plurality of word lines, wherein the plurality of conductive features are positioned on the first doped region.

5. The semiconductor device of claim 4, wherein the plurality of landing pads are positioned between a plurality of bit lines and the first doped region.

6. The semiconductor device of claim 1, further comprising a plurality of isolation structures positioned in the substrate, wherein the plurality of isolation structures are separated from each other and define the plurality of active regions of the substrate.

7. The semiconductor device of claim 1, further comprising a second doped region, wherein each of the plurality of active regions intersects two word lines, and the second doped region is positioned between one of the two word lines and one of a plurality of isolation structures.

8. The semiconductor device of claim 7, wherein the plurality of landing pads are positioned between the plurality of capacitor structures and the second doped regions.

9. The semiconductor device of claim 1, wherein two of a plurality of word lines extend along a first direction and the plurality of active regions extend along a direction that is slanted with respect to the first direction.

10. The semiconductor device of claim 1, further comprising a plurality of bit line contacts positioned above the substrate and a plurality of bit lines positioned above the substrate, wherein one of the plurality of bit line contacts is positioned on the coverage layer and is positioned under one of the plurality of bit lines.

11. The semiconductor device of claim 1, wherein the plurality of capacitor structures comprise a plurality of bottom electrodes inwardly positioned above the substrate, a capacitor insulating layer positioned on the plurality of bottom electrodes, and a top electrode positioned on the capacitor insulating layer.

12. A method for fabricating a semiconductor device, comprising:
   providing a substrate and defining a plurality of active regions in the substrate;
   forming a plurality of conductive features positioned above the substrate in each of the plurality of active regions;
   forming a coverage layer positioned above the substrate in each of the plurality of active regions; and,
   forming a plurality of landing pads positioned above the substrate in each of the plurality of active regions, wherein each of the plurality of landing pads includes an extending axis parallel to a top surface of the substrate, wherein an angle between the extending axes of two adjacent landing pads in each of the plurality of active regions is less than 180 degrees.

13. The method for fabricating the semiconductor device of claim 12, further comprising forming a plurality of capacitor structures positioned above the substrate.

14. The method for fabricating the semiconductor device of claim 13, wherein the plurality of conductive features are positioned below the plurality of capacitor structures.

15. The method for fabricating the semiconductor device of claim 13, wherein the plurality of conductive features are positioned above the plurality of capacitor structures.

16. The method for fabricating the semiconductor device of claim 13, wherein the plurality of capacitor structures comprise a plurality of bottom electrodes inwardly positioned above the substrate, a capacitor insulating layer positioned on the plurality of bottom electrodes, and a top electrode positioned on the capacitor insulating layer.

17. The method for fabricating the semiconductor device of claim 13, wherein the plurality of landing pads are positioned between the plurality of capacitor structures and a plurality of second doped regions.

18. The method for fabricating the semiconductor device of claim 12, further comprising forming a plurality of word lines positioned in the substrate and a first doped region positioned between an adjacent pair of the plurality of word lines, wherein the plurality of conductive features are positioned on the first doped region.

19. The method for fabricating the semiconductor device of claim 18, wherein a plurality of landing pads are positioned between a plurality of bit lines and the first doped region.

20. The method for fabricating the semiconductor device of claim 12, further comprising forming a plurality of bit line contacts and a plurality of bit lines, wherein one of the plurality of bit line contacts is positioned on the coverage layer and is positioned under one of the plurality of bit lines.

* * * * *